(12) United States Patent
Hashimoto

(10) Patent No.: US 7,833,844 B2
(45) Date of Patent: Nov. 16, 2010

(54) SEMICONDUCTOR DEVICE AND PRODUCTION METHOD OF THE SAME

(75) Inventor: Yasunori Hashimoto, Hyogo (JP)

(73) Assignee: Ricoh Company, Ltd., Tokyo (JP)

( * ) Notice: Subject to any disclaimer, the term of this patent is extended or adjusted under 35 U.S.C. 154(b) by 523 days.

(21) Appl. No.: 11/899,295

(22) Filed: Sep. 5, 2007

(65) Prior Publication Data

US 2008/0068047 A1 Mar. 20, 2008

(30) Foreign Application Priority Data

Sep. 15, 2006 (JP) .............................. 2006-250406

(51) Int. Cl.
*H01L 21/82* (2006.01)
(52) U.S. Cl. .................... 438/132; 257/529; 257/209; 257/E23.149; 257/E27.102; 257/E21.592; 438/215; 438/333; 438/467; 438/601
(58) Field of Classification Search ................ 257/204, 257/209, 528, 529, 537, 665, E21.592, E23.149, 257/E27.102, 350, 358, 360, 379, 380, 384; 438/132, 215, 333, 467, 601, 200, 210, 585, 438/624
See application file for complete search history.

(56) References Cited

U.S. PATENT DOCUMENTS

| 4,628,590 A | * | 12/1986 | Udo et al. ................... 438/6 |
| 5,047,826 A | * | 9/1991 | Keller et al. ................. 257/379 |
| 5,821,160 A | * | 10/1998 | Rodriguez et al. ........... 438/601 |
| 5,972,756 A | * | 10/1999 | Kono et al. .................. 438/281 |
| 6,369,409 B1 | * | 4/2002 | Takasu et al. ................ 257/60 |
| 6,372,652 B1 | * | 4/2002 | Verma et al. ................. 438/706 |
| 6,586,282 B1 | * | 7/2003 | Takasu ........................ 438/132 |
| 2004/0227237 A1 | * | 11/2004 | Ueda ........................... 257/734 |
| 2005/0110070 A1 | * | 5/2005 | Omura ........................ 257/311 |
| 2007/0007621 A1 | * | 1/2007 | Omura et al. ................ 257/529 |
| 2007/0128790 A1 | * | 6/2007 | Dainin ........................ 438/238 |

FOREIGN PATENT DOCUMENTS

| JP | 60-44829 | 10/1985 |
| JP | 2001-176976 | 6/2001 |
| JP | 2003-258103 | 9/2003 |
| JP | 2003-264230 | 9/2003 |
| JP | 2004-111420 | 4/2004 |
| JP | 2005-197602 | 7/2005 |

* cited by examiner

*Primary Examiner*—Lynne A Gurley
*Assistant Examiner*—Meiya Li
(74) *Attorney, Agent, or Firm*—Cooper & Dunham LLP

(57) ABSTRACT

A disclosed method of producing a semiconductor device includes the steps of (A) forming a gate electrode and a trimming fuse on a semiconductor substrate; (B) forming a side wall insulating film covering the gate electrode and the trimming fuse; (C) forming a conductive film on the side wall insulating film and patterning the conductive film to form an etching stop layer and a resistance element; (D) forming a side wall on the sides of the gate electrode; (E) repeating, one or more times, sub-steps of forming an interlayer insulating film and of forming an upper wiring layer, and then forming a passivation film; (F) removing the passivation film and the interlayer insulating film in the trimming opening forming area until the etching stop layer is exposed; and (G) forming the trimming opening by removing the etching stop layer in the trimming opening forming area.

9 Claims, 22 Drawing Sheets

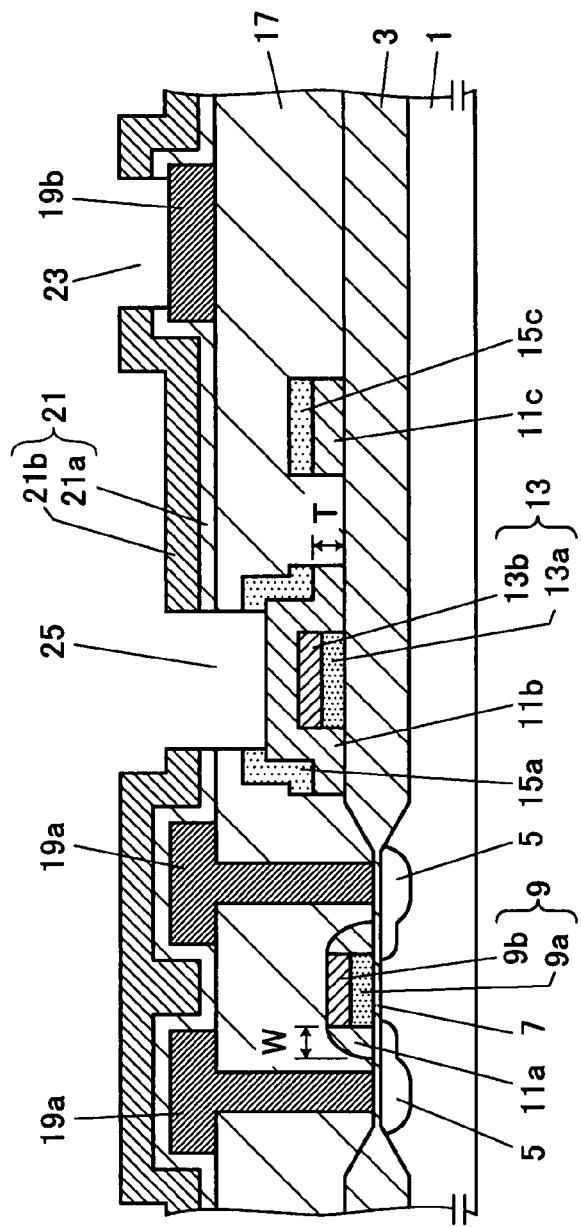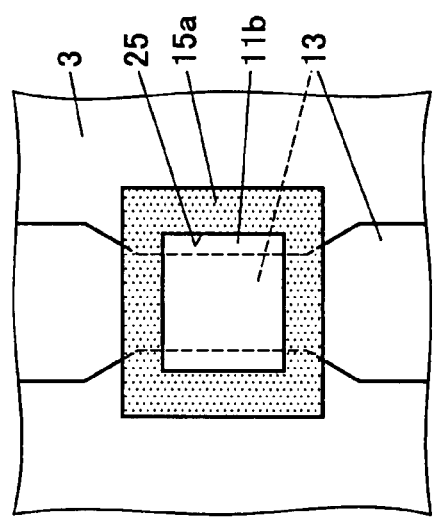
FIG.1A
FIG.1B

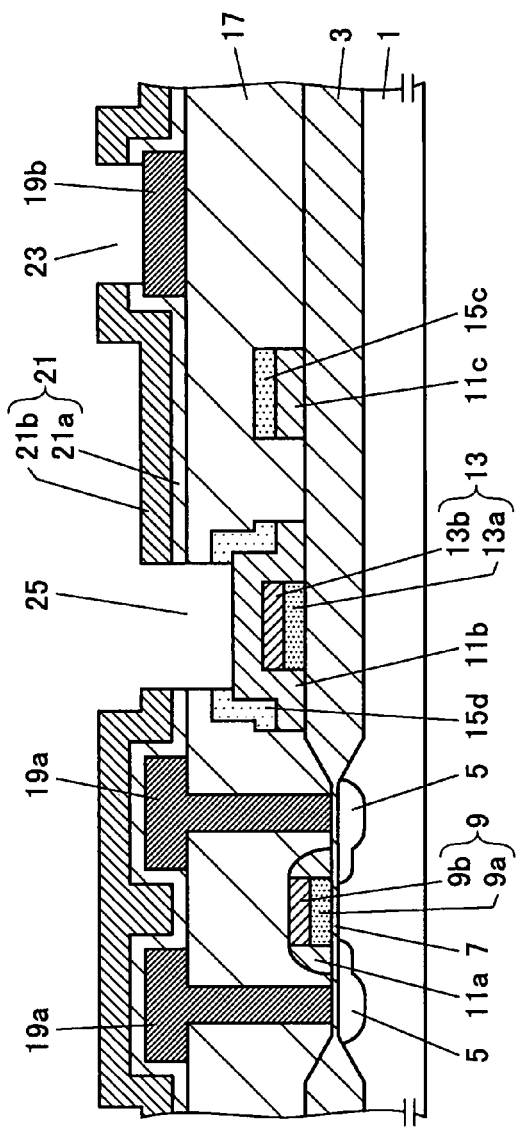
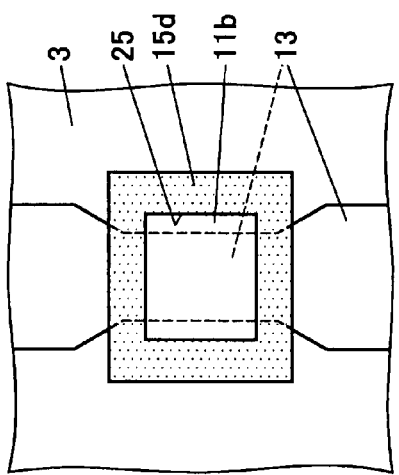
FIG.7A
FIG.7B

SEMICONDUCTOR DEVICE AND PRODUCTION METHOD OF THE SAME

BACKGROUND OF THE INVENTION

1. Field of the Invention

The present invention generally relates to a semiconductor device and a method of producing the semiconductor device. More particularly, this invention relates to a semiconductor device and a method of producing the semiconductor device that comprises a MOS transistor including a gate electrode composed of a conductive material and a side wall formed on the sides of the gate electrode; a trimming fuse composed of a conductive material; a resistance element; and an insulating film covering the MOS transistor, the trimming fuse, and the resistance element, the insulating film having a trimming opening for laser trimming in an area above the trimming fuse where the insulating film is thinner than in other areas.

2. Description of the Related Art

When designing a semiconductor device, its specifications such as electrical resistance are defined so that the device works normally under certain electrical conditions. In a step near the end of a production process of such a semiconductor device, a characteristic test is performed to determine whether the semiconductor device meets the specifications.

Generally speaking, as the integration density of a semiconductor device increases, the number of defective products in a production process increases and the production yield decreases. If such densely-integrated semiconductor devices are discarded because of minor defects, it results in a huge loss. To reduce such a loss, trimming fuses for correcting electrical characteristics are employed in some semiconductor devices.

Generally, a polysilicon film or a metal film is used as the material of a trimming fuse and a laser beam is used to cut a trimming fuse. A trimming fuse is covered by an insulating film and, normally, a portion of the insulating film is etched to form a trimming opening through which the trimming fuse is irradiated with a laser beam. The trimming opening reduces absorption of energy of the laser beam by the insulating film.

In a laser trimming process of cutting a trimming fuse by a laser beam, an underlying film may be damaged if the intensity of the laser beam is too high. To prevent damage to an underlying film, it is important to optimize the intensity of a laser beam and the thickness (hereafter called a "remaining thickness") of the insulating film at the bottom of the trimming opening above a trimming fuse.

Meanwhile, if the insulating film in the trimming opening is entirely removed and a trimming fuse is exposed, it becomes easier to optimize the intensity of a laser beam (see, for example, patent document 1).

However, this configuration may allow moisture to penetrate into the semiconductor device through the trimming opening and may adversely affect the characteristics and reliability of a semiconductor device.

On the other hand, if the remaining thickness is large, it is necessary to increase the intensity of a laser beam to cut the trimming fuse. Such a high-intensity laser beam may scatter and adversely affect elements near the trimming opening.

Therefore, it is important to optimize the remaining thickness of the insulating film at the bottom of the trimming opening.

Meanwhile, when a large number of chips are formed on a wafer, the amount of time necessary to adjust the electrical characteristics of the chips using trimming fuses becomes an important factor determining production efficiency. If the remaining thickness varies from chip to chip, the intensity and irradiation time of a laser beam are determined based on the largest remaining thickness on the wafer. This may reduce the efficiency of a laser trimming process by a laser trimming apparatus. Therefore, it is also important to make the remaining thicknesses as uniform as possible.

Some methods have been proposed to control the remaining thickness of an insulating film at the bottom of a trimming opening.

For example, in a proposed method, a silicon dioxide film is formed as an insulating film on a trimming fuse, a silicon nitride film is formed on the insulating film as an etching stop layer, and another silicon dioxide film is formed on the silicon nitride film. The proposed method controls the thickness of the insulating film using the difference in etching rates of the silicon nitride film and the silicon dioxide film (see, for example, patent documents 2 and 3).

However, since there is not much difference in etching rates between a silicon nitride film and a silicon dioxide film, the remaining thickness of the insulating film becomes inconsistent in a multilayer wiring board and it becomes difficult to stably perform laser trimming. Also, in the proposed method, a silicon nitride film has to be formed additionally as an etching stop layer. Therefore, the proposed method increases the number of steps necessary to produce a semiconductor device.

According to another proposed method, a portion of an undermost wiring pattern (aluminum wiring pattern) of a multilayer wiring structure is used as an etching stop layer to control the remaining thickness of an insulating film at the bottom of a trimming opening above a trimming fuse (see, for example, patent document 4).

With this method, however, the insulating film under the etching stop layer may also be etched when the etching stop layer is removed and, as a result, the remaining thickness of the insulating film above the trimming fuse may become inconsistent.

Another proposed method uses a frame-shaped metal film as an etching stop layer. The frame-shaped metal film is not present in a laser-irradiation area above a trimming fuse but a part of which is exposed in a trimming opening (see, for example, patent document 5).

One problem with this method is that when the frame-shaped metal film is formed by etching a portion of a metal film in the laser-irradiation area, an insulating film in the laser-irradiation area is also etched and, as a result, the remaining thickness of the insulating film above the trimming fuse becomes inconsistent. Another problem with this method is that although the frame-shaped metal film functions as an etching stop layer during the formation of a trimming opening, no etching stop layer is provided in the laser-irradiation area. Accordingly, the insulating film in the laser-irradiation area above the trimming fuse is etched during the formation of the trimming opening and the remaining thickness of the insulating film becomes inconsistent.

In still another proposed method, a silicon dioxide film is formed above a trimming fuse and a silicon-rich-oxide (SRO) film is formed as an etching stop layer on the silicon dioxide film (see, for example, patent document 6).

With this method, however, since there is not much difference in etching rates between an SRO film and a silicon dioxide film, the remaining thickness of the silicon dioxide film becomes inconsistent in a multilayer wiring board and it becomes difficult to stably perform laser trimming. Also, in the proposed method, an SRO film has to be formed additionally as an etching stop layer. Therefore, the proposed method increases the number of steps necessary to produce a semiconductor device.

[Patent document 1] Japanese Examined Patent Application Publication No. 60-44829

[Patent document 2] Japanese Patent Application Publication No. 2001-176976

[Patent document 3] Japanese Patent Application Publication No. 2004-111420

[Patent document 4] Japanese Patent Application Publication No. 2003-258103

[Patent document 5] Japanese Patent Application Publication No. 2003-264230

[Patent document 6] Japanese Patent Application Publication No. 2005-197602

SUMMARY OF THE INVENTION

Embodiments of the present invention provide a semiconductor device and a method of producing the semiconductor device that solve or reduce one or more problems caused by the limitations and disadvantages of the related art.

An embodiment of the present invention provides a method of producing a semiconductor device comprising a semiconductor substrate, a MOS transistor including a gate electrode and a side wall formed on sides of the gate electrode, a trimming fuse, a resistance element, and an insulating film covering the MOS transistor, the trimming fuse, and the resistance element, the insulating film having a trimming opening for laser trimming in an area above the trimming fuse where the insulating film is thinner than in other areas. The method includes the steps of (A) forming the gate electrode and the trimming fuse on the semiconductor substrate; (B) forming a side wall insulating film covering the gate electrode and the trimming fuse; (C) forming a conductive film on the side wall insulating film and patterning the conductive film to form an etching stop layer in an area encompassing a trimming opening forming area where the trimming opening is to be formed and to form the resistance element in a different area; (D) forming the side wall on the sides of the gate electrode by etching back the side wall insulating film using a mask pattern that covers at least the etching stop layer and the resistance element and exposes a portion of the side wall insulating film above the gate electrode and its surrounding area; (E) repeating, one or more times, sub-steps of forming an interlayer insulating film covering the entire semiconductor substrate and of forming an upper wiring layer on the interlayer insulating film, and then forming a passivation film covering the interlayer insulating film and the upper wiring layer; (F) removing the passivation film and the interlayer insulating film in the trimming opening forming area until the etching stop layer is exposed; and (G) forming the trimming opening by removing the etching stop layer in the trimming opening forming area.

Another embodiment of the present invention provides a semiconductor device comprising a semiconductor substrate; a MOS transistor including a gate electrode and a side wall formed on sides of the gate electrode; a trimming fuse; a resistance element; an insulating film covering the MOS transistor, the trimming fuse, and the resistance element, the insulating film having a trimming opening for laser trimming in an area above the trimming fuse where the insulating film is thinner than in other areas; and an etching stop layer residue shaped like a frame surrounding the trimming opening, a cross section of the etching stop layer residue being exposed on an inner wall of the trimming opening. In the semiconductor device, the resistance element is made of a conductive film formed separately from the gate electrode and the trimming fuse and is formed on the semiconductor substrate at least via a side wall insulating film; the thinner portion of the insulating film which thinner portion is under the trimming opening and above the trimming fuse is made of a part of the side wall insulating film; the side wall is formed by etching back the side wall insulating film and the width of the side wall in a direction orthogonal to the sides of the gate electrode is the same as the thickness of the side wall insulating film; and the etching stop layer residue is formed on the side wall insulating film and is made of the same conductive film as that of the resistance element.

BRIEF DESCRIPTION OF THE DRAWINGS

FIG. 1A is a cut-away side view of an exemplary semiconductor device according to an embodiment of the present invention;

FIG. 1B is a plan view of a portion around a trimming fuse of the exemplary semiconductor device;

FIG. 7A is a cut-away side view of an exemplary semiconductor device according to another embodiment of the present invention;

FIG. 7B is a plan view of a portion around a trimming fuse of the exemplary semiconductor device;

DESCRIPTION OF THE PREFERRED EMBODIMENTS

Figure 2A:
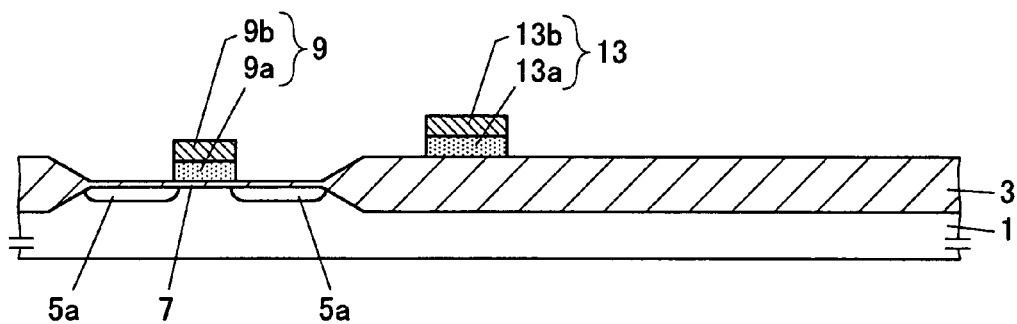
FIGS. 2A through 2C are drawings illustrating steps in an exemplary method of producing the exemplary semiconductor device shown in FIGS. 1A and 1B.
Figure 2B:
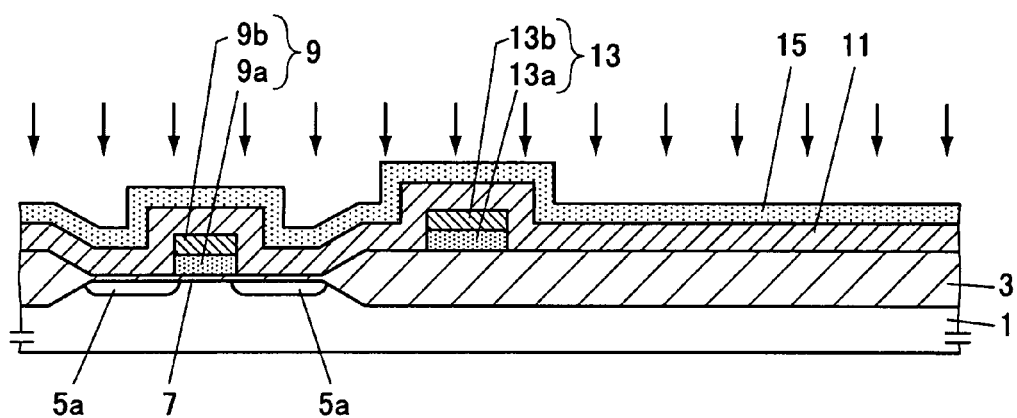
Figure 2C:
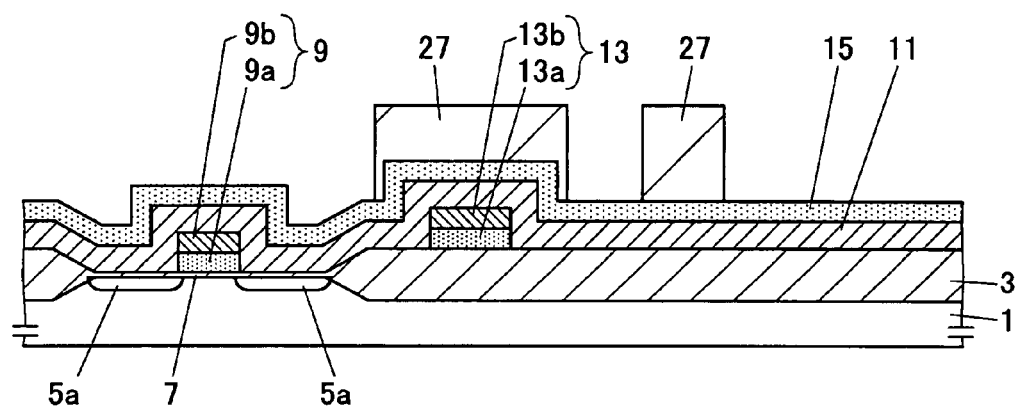

Preferred embodiments of the present invention are described below with reference to the accompanying drawings.

FIG. 1A is a cut-away side view of an exemplary semiconductor device according to an embodiment of the present invention. FIG. 1B is a plan view of a portion around a trimming fuse of the exemplary semiconductor device. In FIG. 1B, an interlayer insulating film and a passivation film are omitted. The exemplary semiconductor device has a single-layer metal wiring structure.

As shown in FIG. 1A, a field oxide film 3 for isolating an element region is formed on a semiconductor substrate 1. Source-drain diffusion layers 5 constituting a MOS transistor are formed in a MOS transistor region of the semiconductor substrate 1. The source-drain diffusion layers 5 have a lightly doped drain (LDD) structure. A gate electrode 9 is formed via a gate oxide film 7 on a channel region of the semiconductor substrate 1 between the source-drain diffusion layers 5. The gate electrode 9 includes a polysilicon film 9a with a thickness of, for example, 250 nm and a tungsten silicide film 9b formed on the polysilicon film 9a and having a thickness of, for example, 80 nm.

A side wall 11a is formed on the sides of the gate electrode 9. The side wall 11a is formed by etching back a sidewall insulating film 11 described later. The width W of the side wall 11a in a direction orthogonal to the sides of the gate electrode 9 is, for example, 150 nm, which is the same as the thickness of the side wall insulating film 11.

A trimming fuse 13 is formed on the field oxide film 3. The trimming fuse 13 may be composed of the same materials as those of the gate electrode 9. The trimming fuse 13, for example, includes a polysilicon film 13a with a thickness of 250 nm and a tungsten silicide film 13b formed on the polysilicon film 13a and having a thickness of 80 nm.

A side wall insulating film 11b is formed on the trimming fuse 13 and the field oxide film 3 in an area encompassing a trimming opening forming area (where a trimming opening 25 described later is to be formed). The side wall 11a and the side wall insulating film 11b are composed of different portions of the same side wall insulating film 11, which is, for example, a silicon dioxide film with a thickness T of 150 nm.

An etching stop layer residue 15a is formed on the side wall insulating film 11b. The etching stop layer residue 15a is shaped like a frame and its cross section is exposed on the inner wall of the trimming opening 25. The etching stop layer residue 15a is composed of a conductive material, for example, a doped polysilicon film having a thickness of 120 nm, which is also used as the material of a resistance element 15c described later. The etching stop layer residue 15a is formed separately from the gate electrode and the trimming fuse 13. The planar shapes of the outlines of the side wall insulating film 11b and the etching stop layer residue 15a are substantially the same.

A resistance element 15c is formed via a side wall insulating film 11c on the field oxide film 3 in an area different from the area where the trimming fuse 13 is formed. The resistance element 15c is composed of the same material as that of the etching stop layer residue 15a. For example, the resistance element 15c is made of a polysilicon film doped with impurity ions for adjusting resistance and having a thickness of 120 nm. Normally, a resistance element made of a silicon film includes a high-resistance part doped with impurity ions for adjusting resistance and low-resistance parts for ohmic contact formed at the ends of the high-resistance part. In FIG. 1A, only the high-resistance part of the resistance element 15c is shown.

The side wall insulating film 11c and the side wall insulating film 11b are formed in the same production step. The side wall 11a, the side wall insulating film 11b, and the side wall insulating film 11c are made of different portions of the same side wall insulating film 11, which is, for example, a silicon dioxide film with a thickness T of 150 nm.

An interlayer insulating film 17 is formed on the field oxide film 3 and on the element region. The interlayer insulating film 17 is, for example, made of a boron-doped phosphosilicate glass (BPSG) film with a thickness of 800 nm.

The interlayer insulating film 17 has connecting holes corresponding to the source-drain diffusion layers 5, the gate electrode 9, the trimming fuse 13, and the resistance element 15c. In FIG. 1A, only the connecting holes corresponding to the source-drain diffusion layers 5 are shown. Metal wiring layers 19a and an electrode pad 19b, which are components of the same wiring layer (upper wiring layer), are formed through the connecting holes and on the interlayer insulating film 17.

A passivation film 21 is formed so as to cover the interlayer insulating film 17, the metal wiring layers 19a, and the electrode pad 19b. The passivation film 21, for example, includes a silicon dioxide film 21a with a thickness of 200 nm and a silicon nitride film 21b formed on the silicon dioxide film 21a and having a thickness of 1000 nm.

A pad opening 23 is formed in the passivation film 21 above the electrode pad 19b.

Figure 3A:
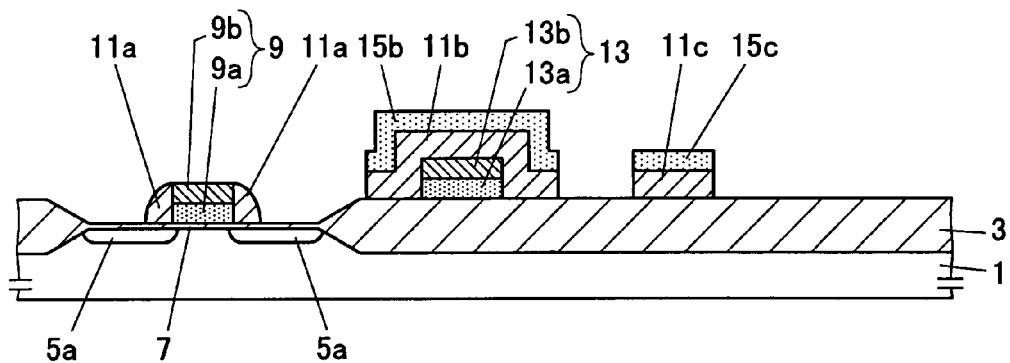
FIGS. 3A through 3C are drawings illustrating subsequent steps in the exemplary method of producing the exemplary semiconductor device.
Figure 3B:
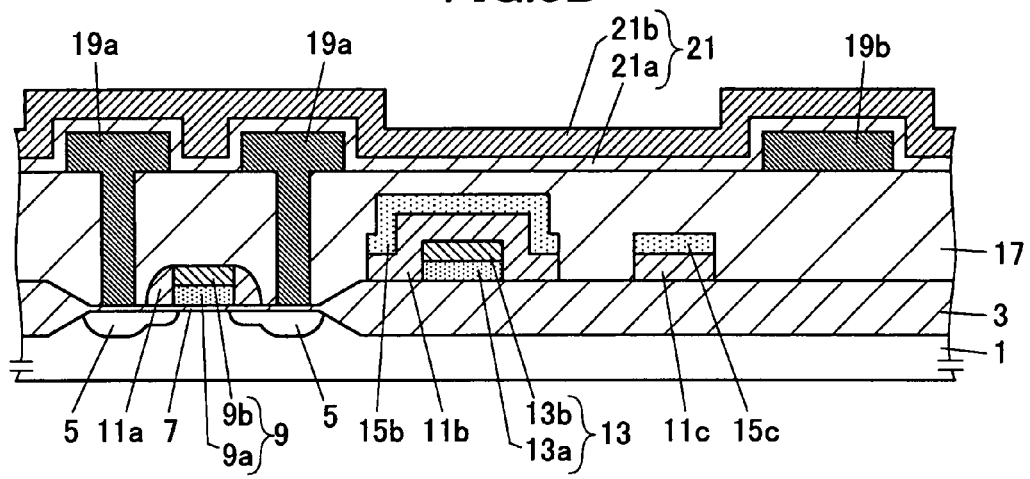
Figure 3C:
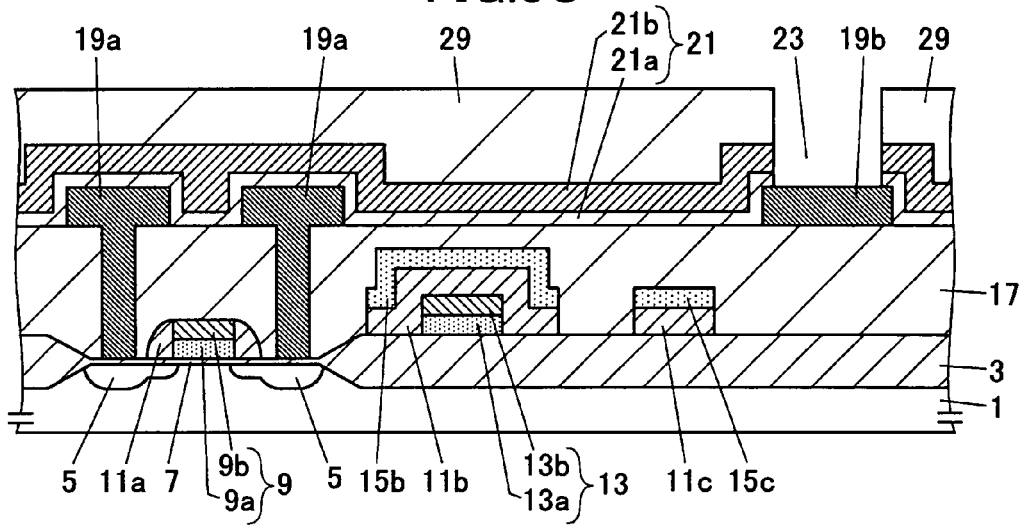
Figure 4A:
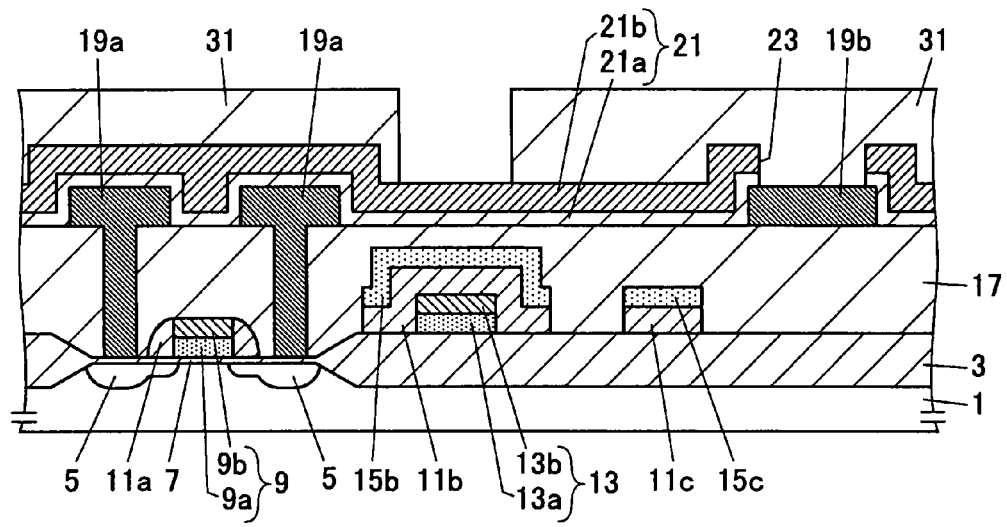
FIGS. 4A through 4C are drawings illustrating remaining steps in the exemplary method of producing the exemplary semiconductor device.
Figure 4B:
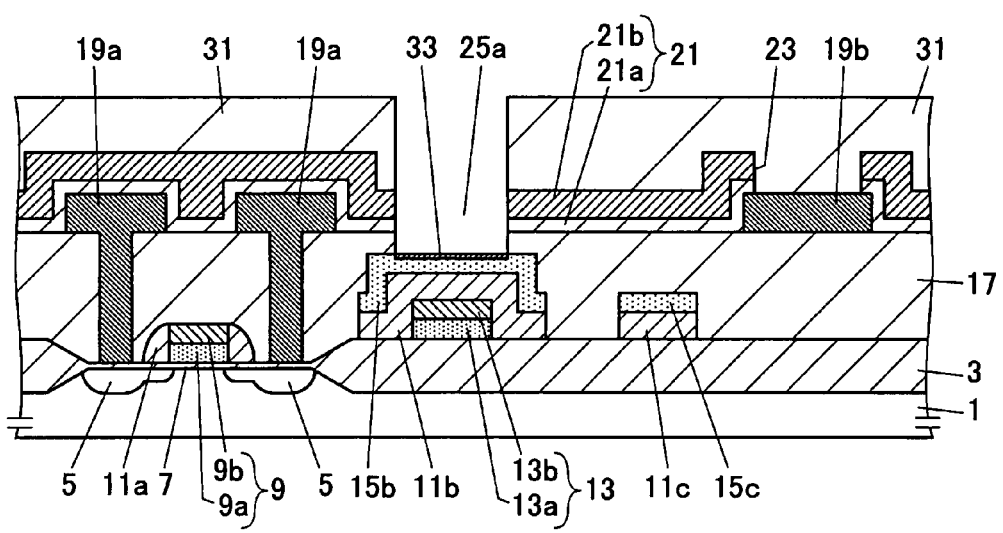
Figure 4C:
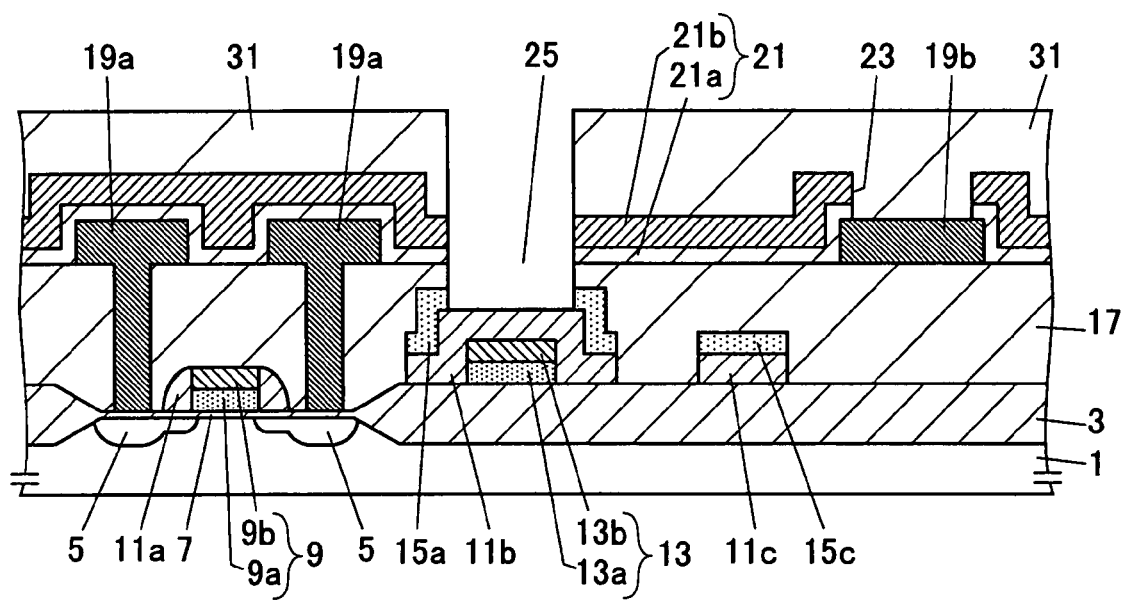

Also, the trimming opening 25 is formed above the trimming fuse 13 through the passivation film 21, the interlayer insulating film 17, and an etching stop layer 15b (see FIG. 3A) a part of which becomes the etching stop layer residue 15a. As described above, the cross section of the etching stop layer residue 15a is exposed on the inner wall of the trimming opening 25.

Figure 5:
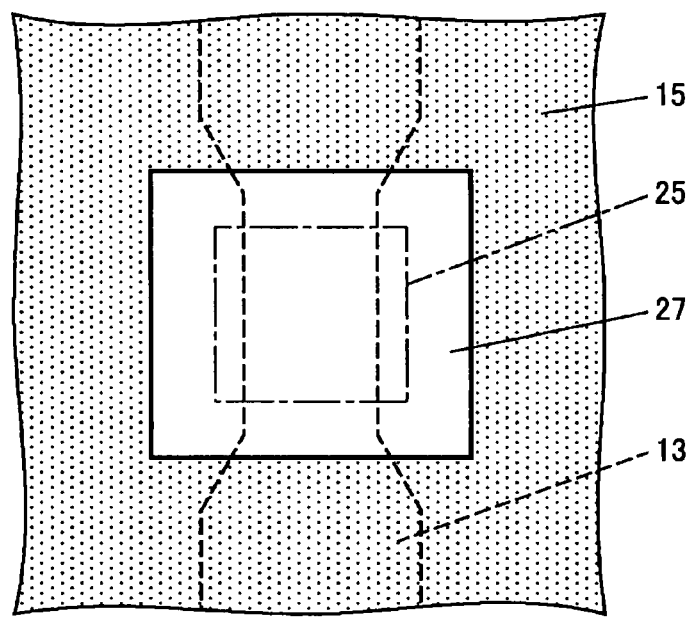
FIG. 5 is a plan view of a portion around a trimming fuse of the exemplary semiconductor device at step 3-1 shown in FIG. 2C.
Figure 6:
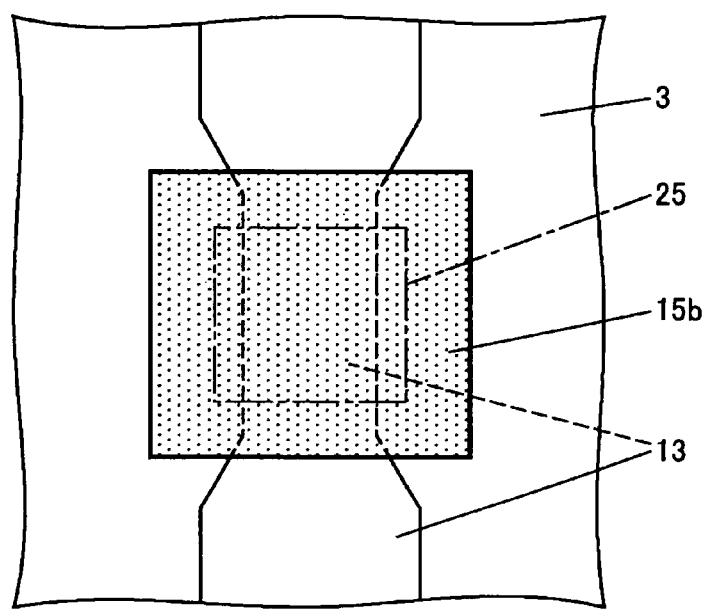
FIG. 6 is a plan view of a portion around a trimming fuse of the exemplary semiconductor device at step 4-1 shown in FIG. 3A.
Figure 8A:
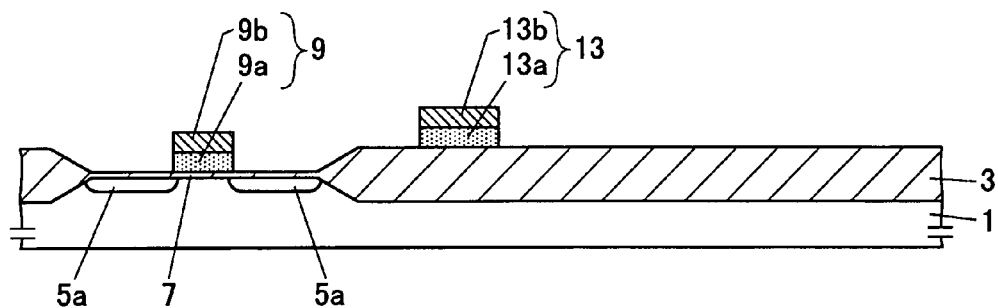
FIGS. 8A through 8C are drawings illustrating steps in an exemplary method of producing the exemplary semiconductor device shown in FIGS. 7A and 7B.
Figure 8B:
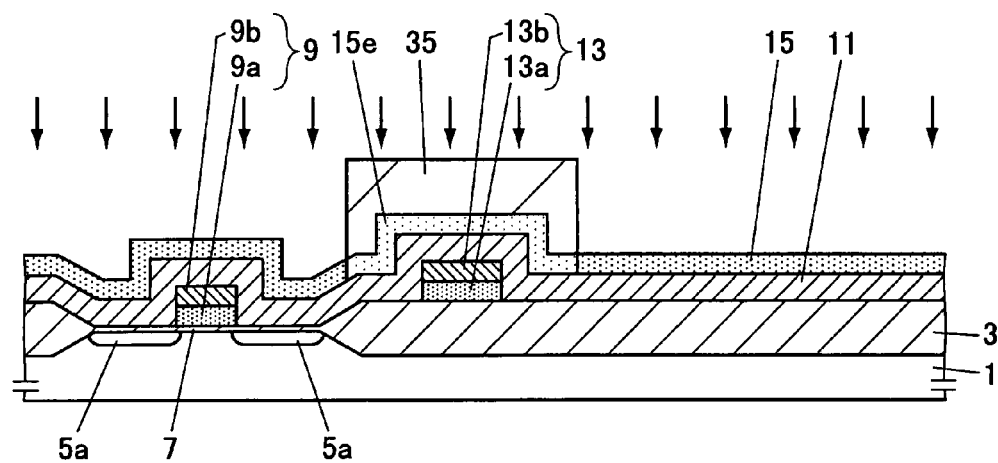
Figure 8C:
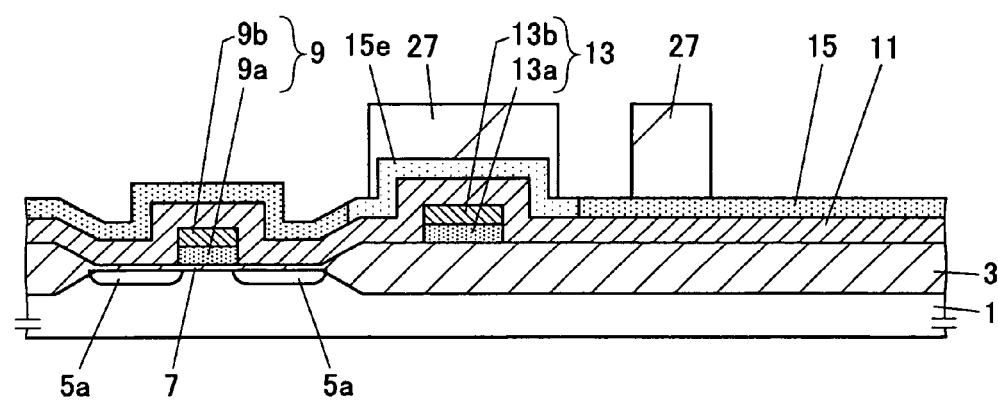
Figure 9A:
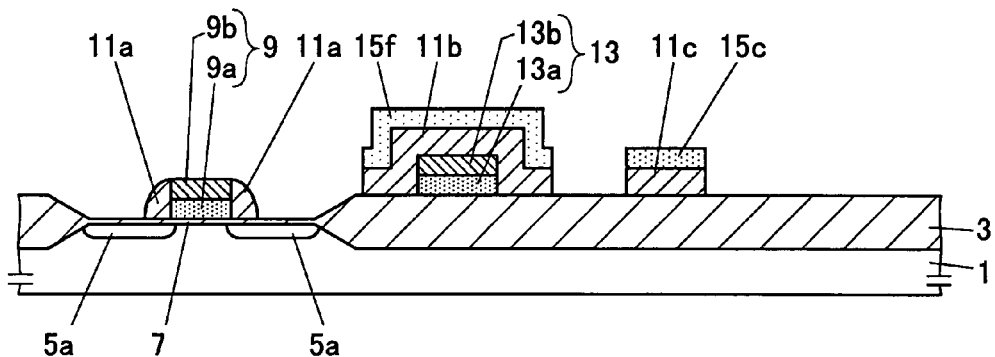
FIGS. 9A through 9C are drawings illustrating subsequent steps in the exemplary method of producing the exemplary semiconductor device.
Figure 9B:
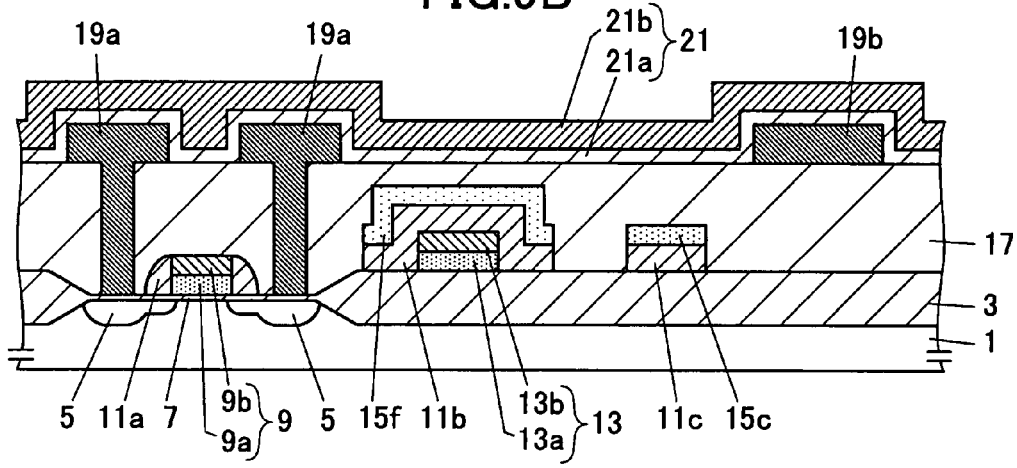
Figure 9C:
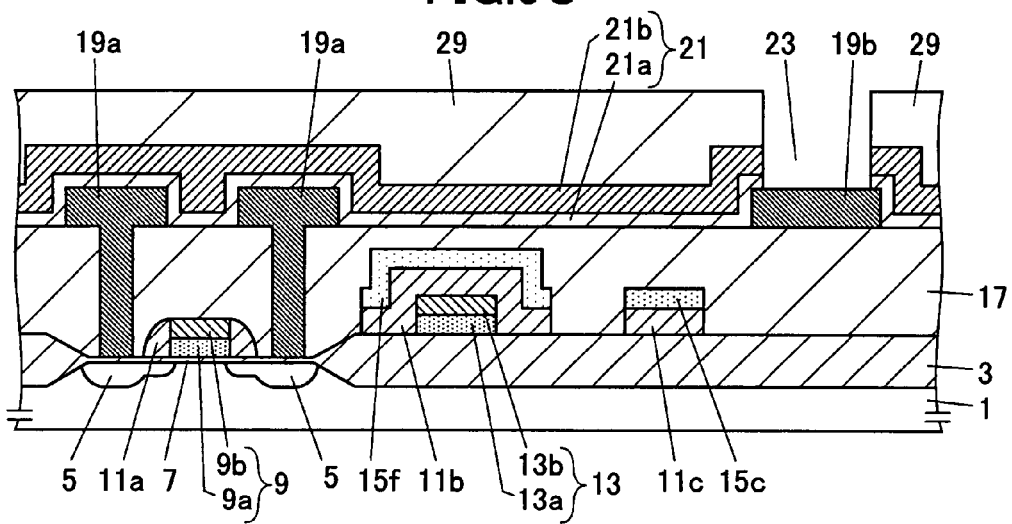
Figure 10A:
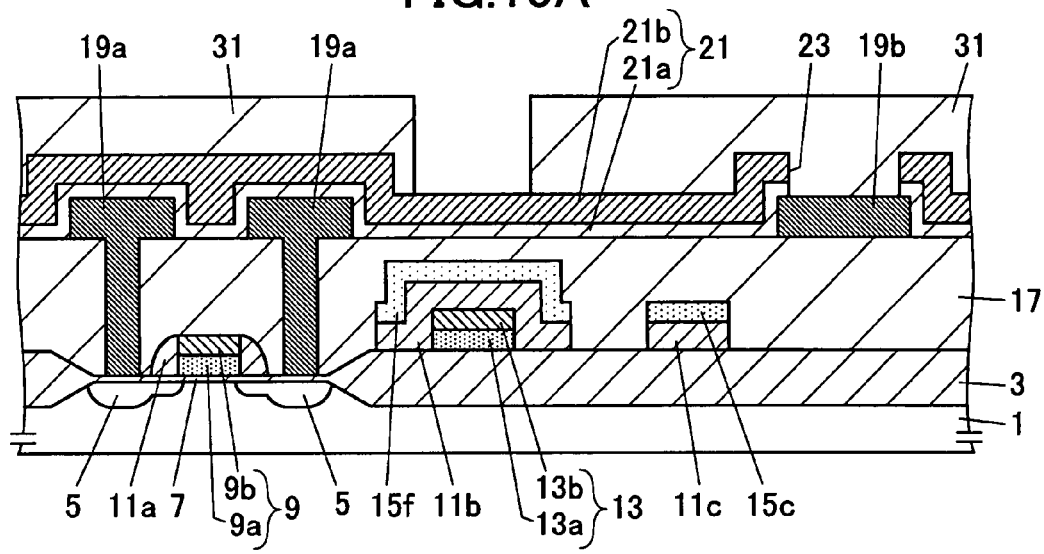
FIGS. 10A through 10C are drawings illustrating remaining steps in the exemplary method of producing the exemplary semiconductor device.
Figure 10B:
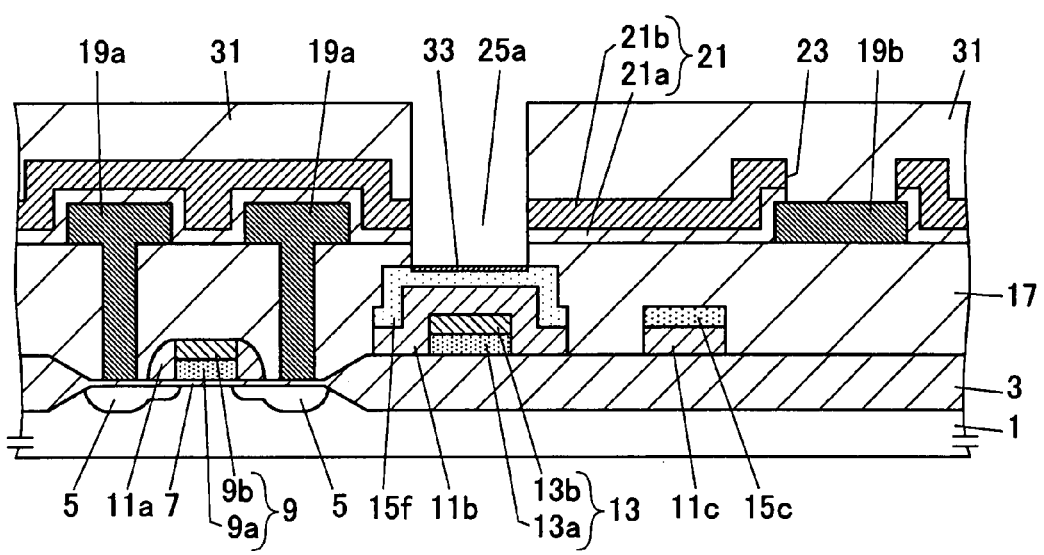
Figure 10C:
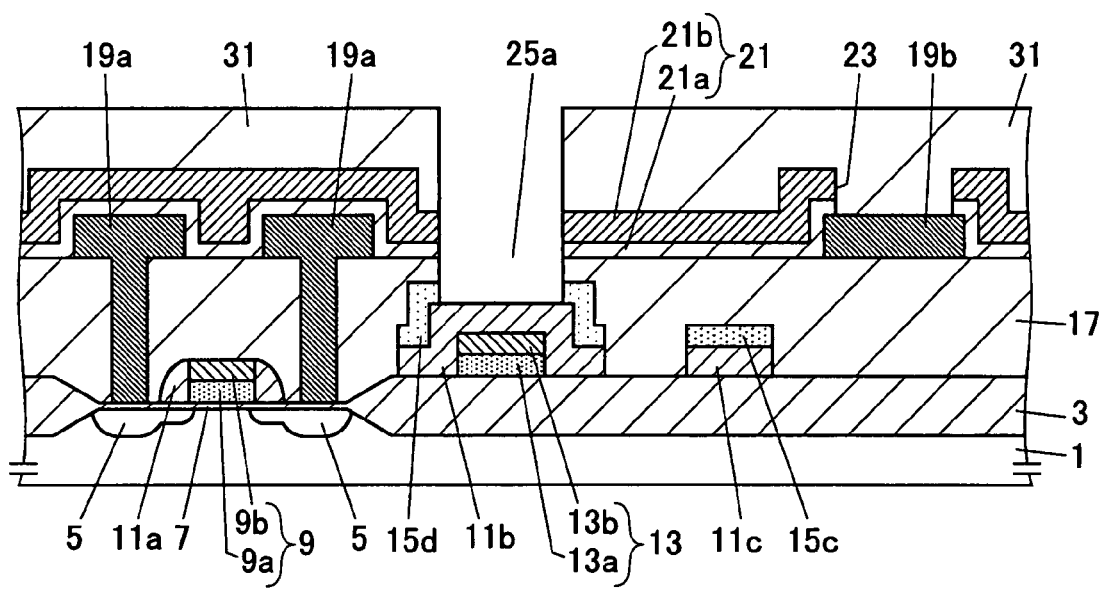

FIGS. 2A through 4C are drawings illustrating steps in an exemplary method of producing the exemplary semiconductor device shown in FIGS. 1A and 1B. FIG. 5 is a plan view of a portion around the trimming fuse 13 of the exemplary semiconductor device at step 3-1 shown in FIG. 2C. FIG. 6 is a plan view of a portion around the trimming fuse 13 of the exemplary semiconductor device at step 4-1 shown in FIG.

3A. Steps 1-1 through 9-1 described below correspond to FIGS. 2A through 4C, respectively.

(1-1: FIG. 2A)

The field oxide film 3 for isolating the element region is formed on the semiconductor substrate 1, for example, by the local oxidation of silicon (LOCOS) method. The gate oxide film 7 is formed on the MOS transistor region of the semiconductor substrate 1. A polysilicon film with a thickness of, for example, 250 nm is formed so as to cover the entire semiconductor substrate 1, and a tungsten silicide film with a thickness of, for example, 80 nm is formed on the polysilicon film. The polysilicon film and the tungsten silicide film are patterned to form the gate electrode 9 including the polysilicon film 9a and the tungsten silicide film 9b and the trimming fuse 13 including the polysilicon film 13a and the tungsten silicide film 13b. Impurity ions are introduced into the MOS transistor region of the semiconductor substrate 1 by ion implantation using the gate electrode 9 as a mask. As a result, low-concentration diffusion layers 5a are formed on the semiconductor substrate 1.

(2-1: FIG. 2B)

The side wall insulating film 11 made of a silicon dioxide film having a thickness of 150 nm is formed, for example, by low-pressure chemical vapor deposition (LPCVD) at 800° C. so as to cover the field oxide film 3, the gate oxide film 7, the gate electrode 9, and the trimming fuse 13. The side wall insulating film 11 is used to form a lightly doped drain (LDD) on the side of the gate electrode 9.

A non-doped polysilicon film (conductive film) with a thickness of, for example, 120 nm is formed on the side wall insulating film 11 by chemical vapor deposition (CVD). Impurity ions for adjusting the resistance of the resistance element 15c are introduced into the non-doped polysilicon film by ion implantation to form the doped polysilicon film 15. The ion implantation is performed, for example, using $BF_2$ as the ion species, with implantation energy of 30 KeV, and at a dose of $3.5 \times 10^{15}$ $cm^{-2}$. Alternatively, the doped polysilicon film 15 may be formed by CVD.

(3-1: FIG. 2C)

A resist pattern (mask pattern) 27 is formed by photolithography so as to cover a resistance element forming area (where the resistance element 15c is to be formed) and an etching stop layer forming area (where the etching stop layer 15b is to be formed) above the trimming fuse 13. The resist pattern 27 has an opening above the gate electrode 9 and its surrounding area. In other words, in a portion around the trimming fuse 13 shown in FIG. 5, the resist pattern 27 covers an area encompassing a trimming opening forming area (where the trimming opening 25 is to be formed).

(4-1: FIG. 3A)

Using the resist pattern 27 as a mask, the doped polysilicon film 15 is etched and, subsequently, the side wall insulating film 11 is etched back to form the side wall 11a on the sides of the gate electrode 9. Then, the resist pattern 27 is removed. As a result, the side wall insulating film 11b and the etching stop layer 15b are formed on the trimming fuse 13 and the field oxide film 3 in an area encompassing the trimming opening forming area (see also FIG. 6). Also, the resistance element 15c and the side wall insulating film 11c are formed on the field oxide film 3.

(5-1: FIG. 3B)

With at least the high-resistance part of the resistance element 15c covered by a resist pattern, impurity ions are introduced into the MOS transistor region of the semiconductor substrate 1 by ion implantation using the gate electrode 9 and the side wall 11a as a mask to form high-concentration diffusion layers. As a result, the source-drain diffusion layers 5 having an LDD structure are formed on the semiconductor substrate 1. In this ion implantation process, normally, impurity ions are also introduced into both ends of the high-resistance part of the resistance element 15c to form low-resistance parts (not shown). By the way, if impurity ions are introduced into the etching stop layer 15b, the etching selectivity between the etching stop layer 15b, the side wall insulating film 11b, and the interlayer insulating film 17 becomes lower. Therefore, it is preferable to also cover the etching stop layer 15b with a resist pattern. However, even if impurity ions are introduced into the etching stop layer 15b in high concentration, the etching selectivity between the etching stop layer 15b and the side wall insulating film 11b remains substantially high. Therefore, even if impurity ions are introduced into the etching stop layer 15b, it does not cause a serious problem. In this embodiment, it is assumed that the etching stop layer 15b is covered by a resist pattern to prevent impurity ions from being introduced into the etching stop layer 15b.

The interlayer insulating film 17 having a thickness of 800 nm and made of, for example, a boron-doped phospho-silicate glass (BPSG) film is formed by CVD so as to cover the entire semiconductor substrate 1. Connecting holes corresponding to the source-drain diffusion layers 5, the gate electrode 9, the trimming fuse 13, and the resistance element 15c are formed in the interlayer insulating film 17 by photolithography and etching. In FIGS. 3A through 4C, only the connecting holes corresponding to the source-drain diffusion layers 5 are shown. The metal wiring layers 19a and the electrode pad 19b are formed through the connecting holes and on the interlayer insulating film 17. Then, the passivation film 21 is formed as a protective film on the interlayer insulating film 17 so as to cover the metal wiring layers 19a and the electrode pad 19b. The passivation film 21 includes the silicon dioxide film 21a and the silicon nitride film 21b formed on the silicon dioxide film 21a.

(6-1: FIG. 3C)

A resist pattern 29 having an opening corresponding to a pad opening forming area (where the pad opening 23 is to be formed) above the electrode pad 19b is formed on the passivation film 21 by lithography. Using the resist pattern 29 as a mask, a portion of the passivation film 21 above the electrode pad 19b is removed to form the pad opening 23.

(7-1: FIG. 4A)

The resist pattern 29 is removed. A resist pattern 31 having an opening corresponding to the trimming opening forming area is formed on the passivation film 21 by lithography. The resist pattern 31 covers the pad opening 23.

(8-1: FIG. 4B)

Using the resist pattern 31 as a mask, the passivation film 21 and the interlayer insulating film 17 are etched until the etching stop layer 15b is exposed. This etching process is performed, for example, using a magnetic-field-assisted reactive ion etching apparatus with the following conditions: RF power=1700 W; mixed gas=CO (155 sccm), $CHF_3$ (45 sccm), and $O_2$ (6 sccm); and pressure=40 mTorr. As a result, an opening 25a is formed through the passivation film 21 and the interlayer insulating film 17. Since the etching stop layer 15b is larger than the opening 25a when seen from above, the side wall insulating film 11b is not etched even when the interlayer insulating film 17 is etched. Thus, the etching process is entirely stopped by the etching stop layer 15b. In this step, as a result of etching the interlayer insulating film 17, a small amount of an etching product composed of C—F (C—F etching product 33) is formed on the etching stop layer 15b at the bottom of the opening 25a.

Meanwhile, with the above etching conditions, the etching rate of a silicon nitride film is about 540 nm/min, the etching rate of a BPSG film is about 600 nm/min, and the etching rate of a polysilicon film is about 37 nm/min. This means that removing the entire etching stop layer 15b made of a polysilicon film with a thickness of 120 nm amounts to over-etching about 1945 nm of a BPSG film (the interlayer insulating film 17). Accordingly, the etching stop layer 15b is sufficient to stop the etching process. Although the exemplary semiconductor device of this embodiment has a single-layer metal wiring structure, the etching stop layer 15b may function sufficiently even if the exemplary semiconductor device has a multilayer wiring structure and the thickness of an insulating film above the etching stop layer 15b varies largely. Also, the etching selectivity between the etching stop layer 15b made of a polysilicon film and a silicon dioxide insulating film may be improved further under certain etching conditions.

(9-1: FIG. 4C)

The C—F etching product 33 and the etching stop layer 15b are etched using, for example, a microwave plasma etching apparatus with the following conditions: microwave power=400 W; mixed gas=$CI_2$ (45 sccm), HBr (75 sccm), and $O_2$ (3 sccm); pressure=0.5 Pa; and RF power=80 W. As a result, the trimming opening 25 is formed. Also, around the trimming opening 25, the etching stop layer residue 15a is formed from the etching stop layer 15b.

After the above steps, the resist pattern 31 is removed (see FIG. 1A).

In an electrical characteristic test of the exemplary semiconductor device described above, a resist pattern having openings in areas corresponding to the pad opening 23 for bonding and the trimming opening 25 is formed by photolithography on the passivation film 21. According to the test results, if necessary, the electrical characteristic of the exemplary semiconductor device is adjusted by irradiating and thereby cutting the trimming fuse 13 with a laser beam through the trimming opening 25 and the side wall insulating film 11b.

The etching process at step 9-1 is performed with a high power, for example, with an RF power of 80 W to prevent formation of an etching residue caused by the C—F etching product 33. With the etching conditions of step 9-1, the etching rate of a polysilicon film is about 300 nm/min and the etching rate of a silicon dioxide film is about 35 nm/min. This means that even if the etching stop layer 15b made of a polysilicon film with a thickness of 120 nm is over-etched by 100%, the side wall insulating film 11b made of a silicon dioxide film with a thickness of 150 nm is removed only about 14 nm or about 10%. Accordingly, the etching stop layer 15b makes it possible to accurately control the remaining thickness. The process of etching the etching stop layer 15b and the subsequent processes are substantially the same in a single-layer metal wiring structure and a multilayer metal wiring structure. Therefore, the above embodiment provides advantageous effects also in the case of a multilayer metal wiring structure.

As described above, the etching process at step 9-1 is performed with a high power to prevent formation of an etching residue caused by the C—F etching product 33. Consequently, a small amount of the side wall insulating film 11b is etched.

To prevent this, the etching process on the etching stop layer 15b may be performed in two stages. For example, in a first stage, the etching stop layer 15b is etched with the above conditions. In a second stage, if over-etching is detected, the RF power is changed to, for example, 20 W so that the etching rate of a silicon dioxide film is reduced to about one tenth. This method makes it possible to reduce the amount of the side wall insulating film 11b to be removed and thereby to more accurately control the remaining thickness.

The timing of switching from the first stage to the second stage is not limited to the detection of over-etching. For example, the etching process may be switched to the second stage when 90% of the etching stop layer 15b is etched in the first stage.

In steps 6-1 through 9-1 above, the pad opening 23 and the trimming opening 25 are formed in separate steps. This is to prevent the electrode pad 19b from being etched. If the electrode pad 19b is exposed while the etching stop layer 15b is etched with $CI_2$ gas to form the trimming opening 25, the electrode pad 19b is also etched by the $CI_2$ gas. Separating the steps also prevents a reaction product of metal of the electrode pad 19b from being formed, adhering to the upper surface of the etching stop layer 15b, and thereby inhibiting the etching process of the etching stop layer 15b.

FIG. 7A is a cut-away side view of an exemplary semiconductor device according to another embodiment of the present invention. FIG. 7B is a plan view of a portion around a trimming fuse of the exemplary semiconductor device. In FIG. 7B, an interlayer insulating film and a passivation film are omitted. The exemplary semiconductor device has a single-layer metal wiring structure. In FIGS. 7A and 7B, the same reference numbers are used for parts corresponding to those of the exemplary semiconductor device shown in FIGS. 1A and 1B, and descriptions of those parts are omitted.

The exemplary semiconductor device of this embodiment is different from that shown in FIGS. 1A and 1B in that an etching stop layer residue 15d on the side wall insulating film 11b covering the trimming fuse 13 is made of a non-doped polysilicon film. The etching stop layer residue 15d is shaped like a frame surrounding the trimming opening 25 and its cross section is exposed on the inner wall of the trimming opening 25. The thickness of the etching stop layer residue 15d is, for example, 120 nm.

The etching stop layer residue 15d and the resistance element 15c are made from different portions of the same non-doped polysilicon film (conductive film). The resistance element 15c is formed by covering the area where the etching stop layer residue 15d and the trimming opening 25 are to be formed with a resist pattern, introducing impurity ions for adjusting resistance into the non-doped polysilicon film using the resist pattern as a mask, and then patterning the doped-polysilicon film.

Figure 11:
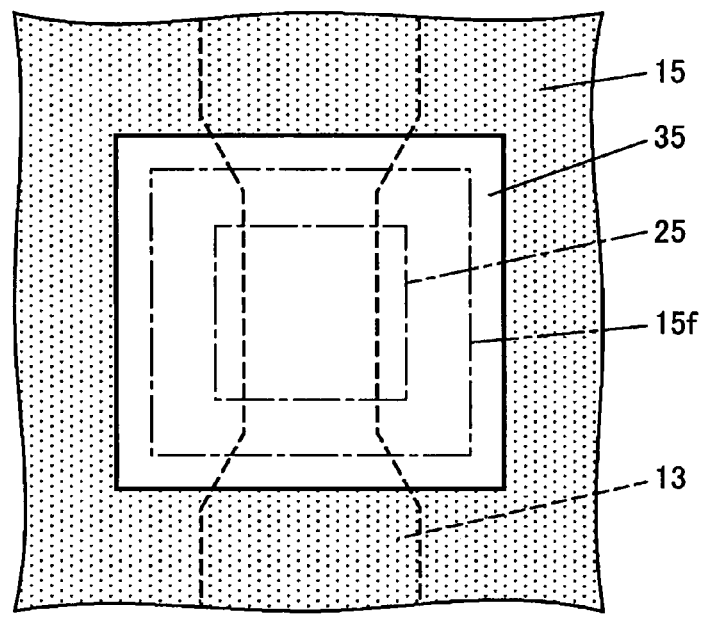
FIG. 11 is a plan view of a portion around a trimming fuse of the exemplary semiconductor device at step 2-2 shown in FIG. 8B.
Figure 12:
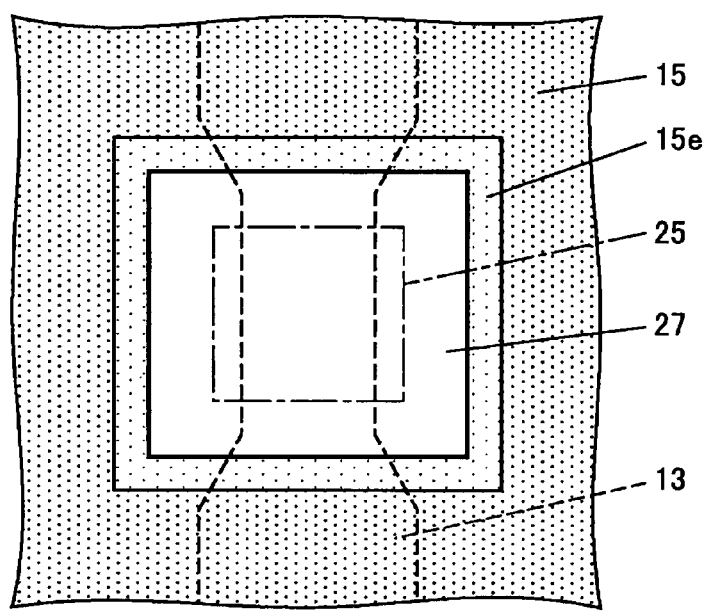
FIG. 12 is a plan view of a portion around a trimming fuse of the exemplary semiconductor device at step 3-2 shown in FIG. 8C.
Figure 13:
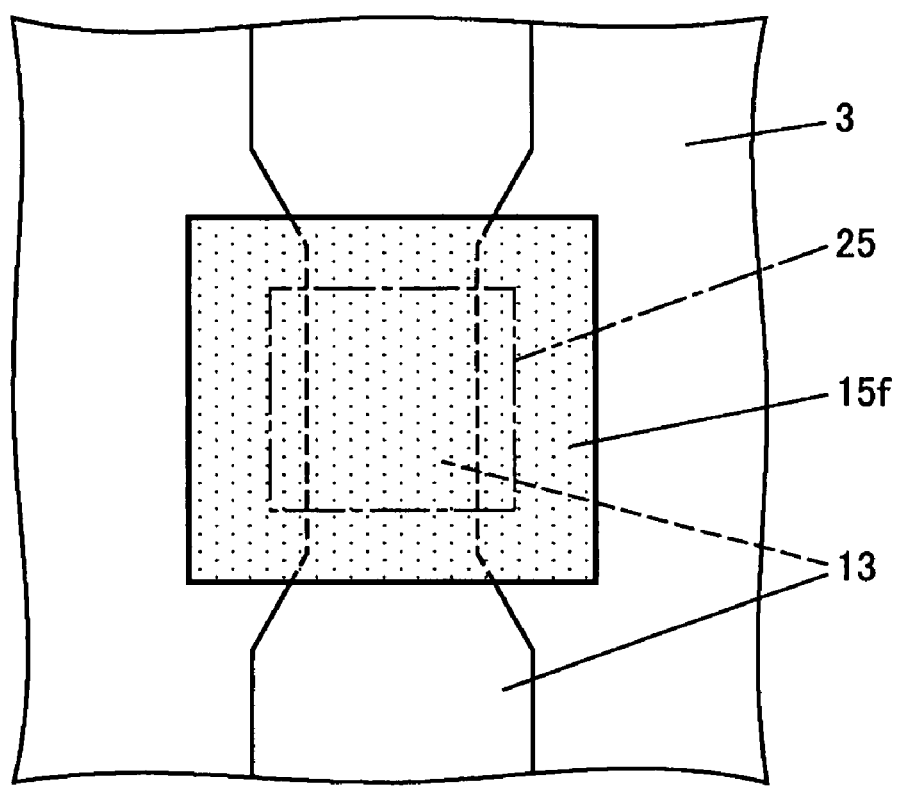
FIG. 13 is a plan view of a portion around a trimming fuse of the exemplary semiconductor device at step 4-2 shown in FIG. 9A.

FIGS. 8A through 10C are drawings illustrating steps in an exemplary method of producing the exemplary semiconductor device shown in FIGS. 7A and 7B. FIG. 11 is a plan view of a portion around the trimming fuse 13 of the exemplary semiconductor device at step 2-2 shown in FIG. 8B. FIG. 12 is a plan view of a portion around the trimming fuse 13 of the exemplary semiconductor device at step 3-2 shown in FIG. 8C. FIG. 13 is a plan view of a portion around the trimming fuse 13 of the exemplary semiconductor device at step 4-2 shown in FIG. 9A. Steps 1-2 through 9-2 described below correspond to FIGS. 8A through 10C, respectively.

(1-2: FIG. 8A)

In substantially the same manner as in step 1-1 (FIG. 2A), the field oxide film 3, the low-concentration diffusion layers 5a, the gate oxide film 7, the gate electrode 9 including the polysilicon film 9a and the tungsten silicide film 9b, and the trimming fuse 13 including the polysilicon film 13a and the tungsten silicide film 13b are formed on the semiconductor substrate 1.

(2-2: FIG. 8B)

In substantially the same manner as in step 2-1 (FIG. 2B), the side wall insulating film 11 is formed and a non-doped polysilicon film (conductive film) with a thickness of 120 nm is formed on the side wall insulating film 11. A resist pattern 35 is formed on the non-doped polysilicon film so as to cover an area encompassing an etching stop layer forming area (where an etching stop layer 15*f* is to be formed) (see also FIG. 11). The etching stop layer forming area includes a trimming opening forming area (where the trimming opening 25 is to be formed). Using the resist pattern 35 as a mask, impurity ions for adjusting the resistance of the resistance element 15*c* are introduced into the non-doped polysilicon film by ion implantation. The impurity-ion-implanted portion of the non-doped polysilicon film becomes a doped polysilicon film 15 and a portion of the non-doped polysilicon film under the resist pattern 35 becomes a non-doped polysilicon film 15*e*. The ion implantation is performed, for example, using $BF_2$ as the ion species, with implantation energy of 30 KeV, and at a dose of $3.5 \times 10^{15}$ cm$^{-2}$.

(3-2: FIG. 8C)

The resist pattern 35 is removed. A resist pattern 27 is formed by photolithography so as to cover a resistance element forming area (where the resistance element 15*c* is to be formed) and the etching stop layer forming area above the trimming fuse 13. The resist pattern 27 has an opening above the gate electrode 9 and its surrounding area. In other words, in a portion around the trimming fuse 13 shown in FIG. 12, the resist pattern 27 is formed on the non-doped polysilicon film 15*e* so as to cover an area encompassing the trimming opening forming area.

(4-2: FIG. 9A)

Using the resist pattern 27 as a mask, the doped polysilicon film 15 and the non-doped polysilicon film 15*e* are etched and, subsequently, the side wall insulating film 11 is etched back to form the side wall 11*a* on the sides of the gate electrode 9. Then, the resist pattern 27 is removed. As a result, the side wall insulating film 11*b* and the etching stop layer 15*f* made of a non-doped polysilicon film are formed on the trimming fuse 13 and the field oxide film 3 in an area encompassing the trimming opening forming area (see also FIG. 13). Also, the resistance element 15*c* and the side wall insulating film 11*c* are formed on the field oxide film 3.

(5-2: FIG. 9B)

In substantially the same manner as in step 5-1 (FIG. 3B), the source-drain diffusion layers 5, the interlayer insulating film 17, connecting holes, the metal wiring layers 19*a*, the electrode pad 19*b*, and the passivation film 21 including the silicon dioxide film 21*a* and the silicon nitride film 21*b* are formed. During the ion implantation process for forming the source-drain diffusion layers 5, impurity ions are not implanted into the etching stop layer 15*f*.

(6-2: FIG. 9C)

In substantially the same manner as in step 6-1 (FIG. 3C), the pad opening 23 is formed in the passivation film 21 above the electrode pad 19*b* using the resist pattern 29 as a mask.

(7-2: FIG. 10A)

In substantially the same manner as in step 7-1 (FIG. 4A), the resist pattern 29 is removed and the resist pattern 31 having an opening in the trimming opening forming area is formed on the passivation film 21.

(8-2: FIG. 10B)

In substantially the same manner as in step 8-1 (FIG. 4B), the passivation film 21 and the interlayer insulating film 17 are etched using the resist pattern 31 as a mask until the etching stop layer 15*f* is exposed. As a result, the opening 25*a* is formed through the passivation film 21 and the interlayer insulating film 17. Since the etching stop layer 15*f* is larger than the opening 25*a* when seen from above, the side wall insulating film 11*b* is not etched even when the interlayer insulating film 17 is etched. Thus, the etching process is entirely stopped by the etching stop layer 15*f*. In this step, as a result of etching the interlayer insulating film 17, a small amount of an etching product composed of C—F (C—F etching product 33) is formed on the etching stop layer 15*f* at the bottom of the opening 25*a*.

Meanwhile, with the etching conditions of step 8-2, the etching rate of a silicon nitride film is about 540 nm/min, the etching rate of a BPSG film is about 600 nm/min, and the etching rate of a non-doped polysilicon film is about 37 nm/min. This means that removing the entire etching stop layer 15*f* made of a non-doped polysilicon film with a thickness of 120 nm amounts to over-etching about 1945 nm of a BPSG film (the interlayer insulating film 17). Also, compared with the etching stop layer 15*b* made of a doped polysilicon film, the etching stop layer 15*f* made of a non-doped polysilicon film shows better etching selectivity with an insulating film made of a silicon dioxide film. The etching selectivity between the etching stop layer 15*f* and an insulating film made of a silicon dioxide film may be improved further by adjusting etching conditions.

(9-2: FIG. 10C)

The C—F etching product 33 and the etching stop layer 15*f* are etched using, for example, a microwave plasma etching apparatus with the following conditions: microwave power=400 W; mixed gas=$Cl_2$ (45 sccm), HBr (75 sccm), and 02 (3 sccm); pressure=0.5 Pa; and RF power=80 W. As a result, the trimming opening 25 is formed. Also, around the trimming opening 25, the etching stop layer residue 15*d* is formed from the etching stop layer 15*f*.

After the above steps, the resist pattern 31 is removed (see FIG. 7A).

With the etching conditions of step 9-2, the etching rate of a non-doped polysilicon film is about 300 nm/min and the etching rate of a silicon dioxide film is about 35 nm/min. This means that even if the etching stop layer 15*f* made of a polysilicon film with a thickness of 120 nm is over-etched by 100%, the side wall insulating film 11*b* made of a silicon dioxide film with a thickness of 150 nm is removed only about 14 nm. Therefore, compared with the etching stop layer 15*b* made of a doped polysilicon film, the etching stop layer 15*f* made of a non-doped polysilicon film makes it possible to more accurately control the remaining thickness.

The etching process in step 9-2 may also be performed in two stages as described above.

According to the exemplary production method described above, the non-doped polysilicon film 15*e* covering an area encompassing the etching stop layer forming area is formed in step 2-2 and the etching stop layer 15*f* made entirely of a non-doped polysilicon film is formed in steps 3-2 and 3-3. Alternatively, step 2-2 may be designed to form a non-doped polysilicon film at least in the trimming opening forming area and steps 3-2 and 3-3 may be designed to form an etching stop layer including a first part made of a non-doped polysilicon film covering at least the trimming opening forming area and a second part surrounding the first part and made of a doped polysilicon film. Still, when misalignment of an etching mask is taken into account, the entire etching stop layer is preferably made of a non-doped polysilicon film.

Figure 14A:
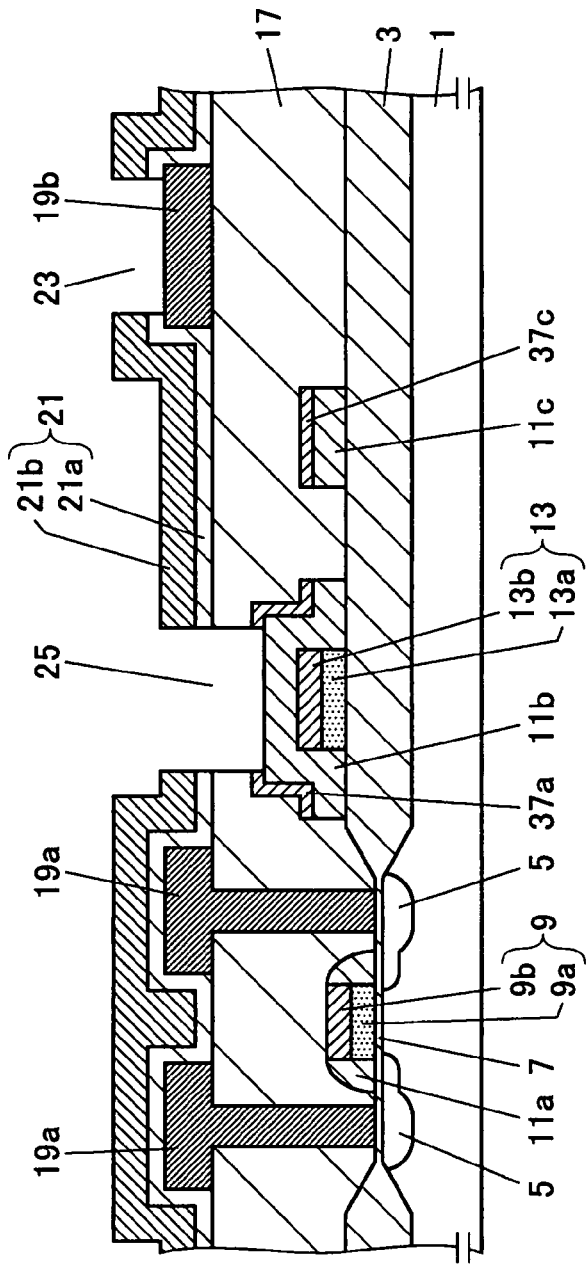
FIG. 14A is a cut-away side view of an exemplary semiconductor device according to still another embodiment of the present invention.
Figure 14B:
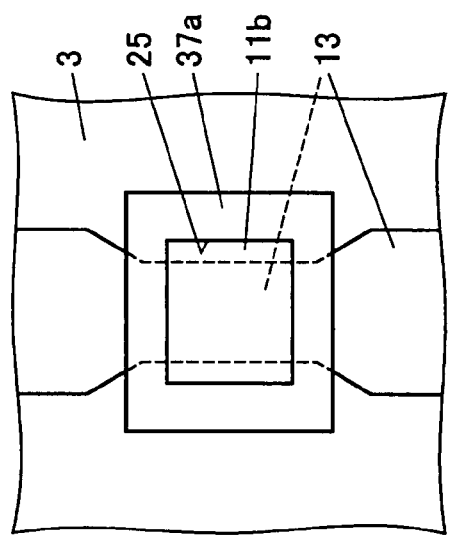
FIG. 14B is a plan view of a portion around a trimming fuse of the exemplary semiconductor device.
Figure 15A:
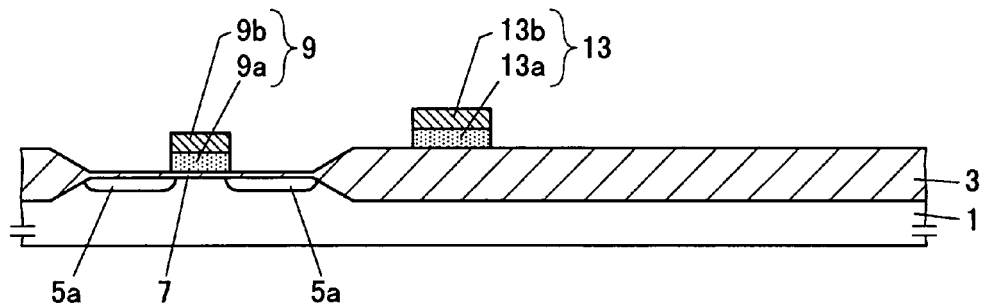
FIGS. 15A through 15C are drawings illustrating steps in an exemplary method of producing the exemplary semiconductor device shown in FIGS. 14A and 14B.
Figure 15B:
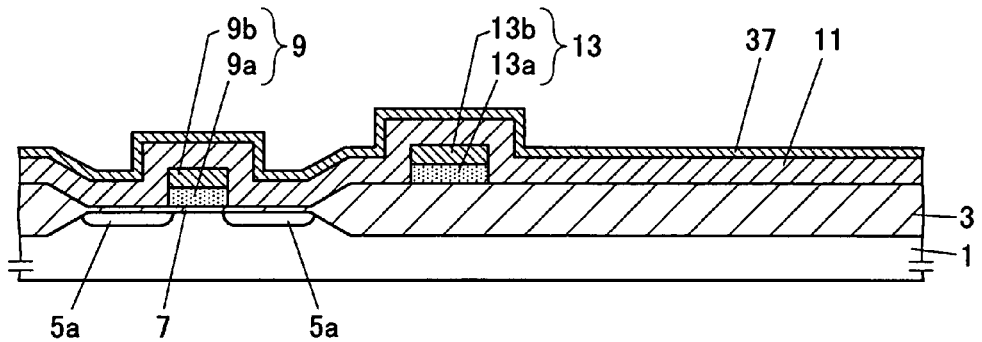
Figure 15C:
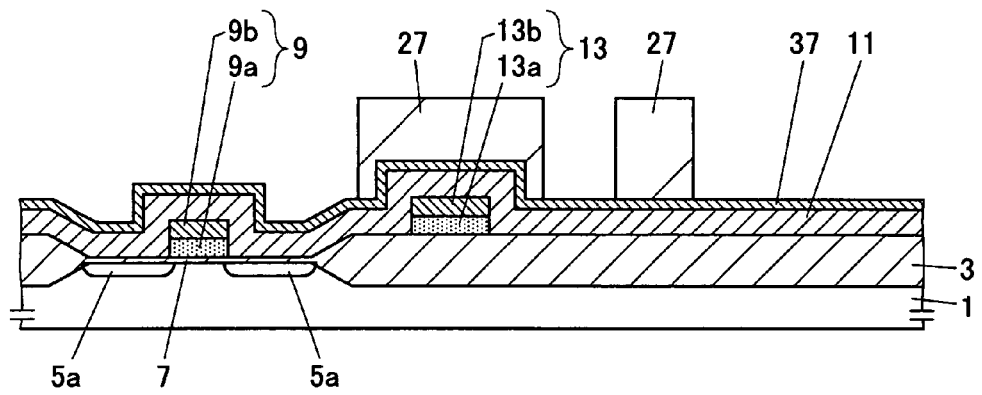
Figure 16A:
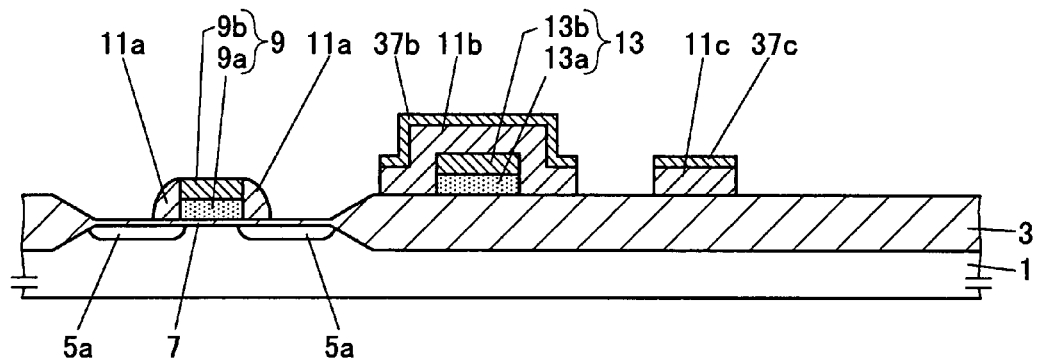
FIGS. 16A through 16C are drawings illustrating subsequent steps in the exemplary method of producing the exemplary semiconductor device.
Figure 16B:
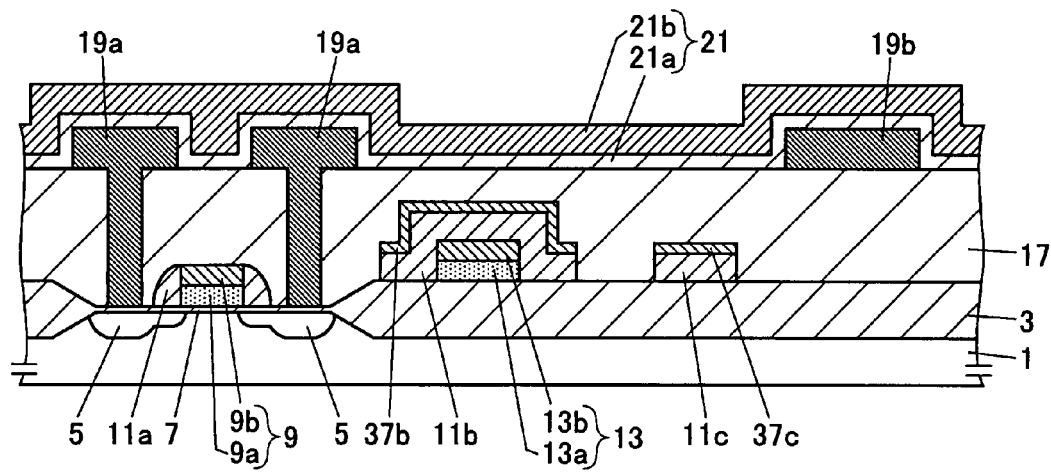
Figure 16C:
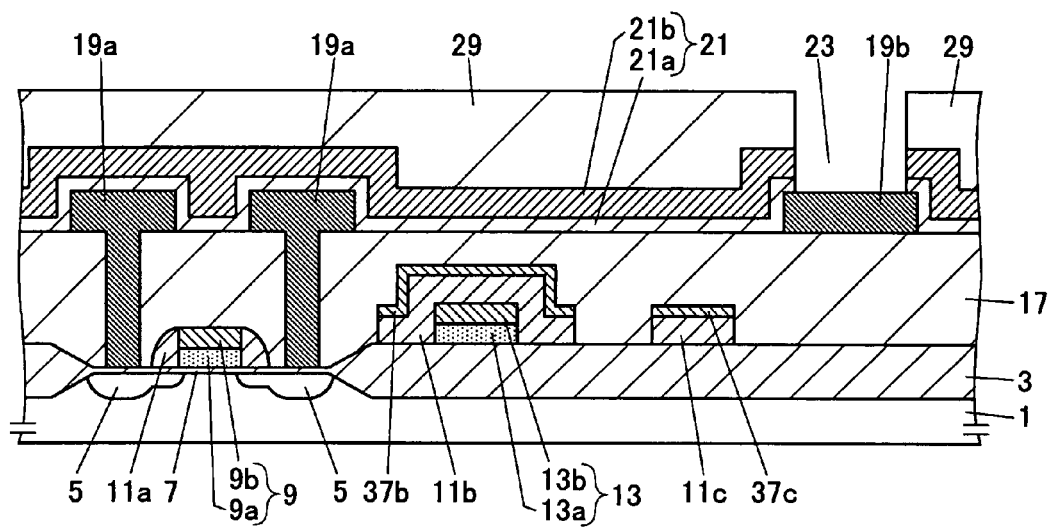
Figure 17A:
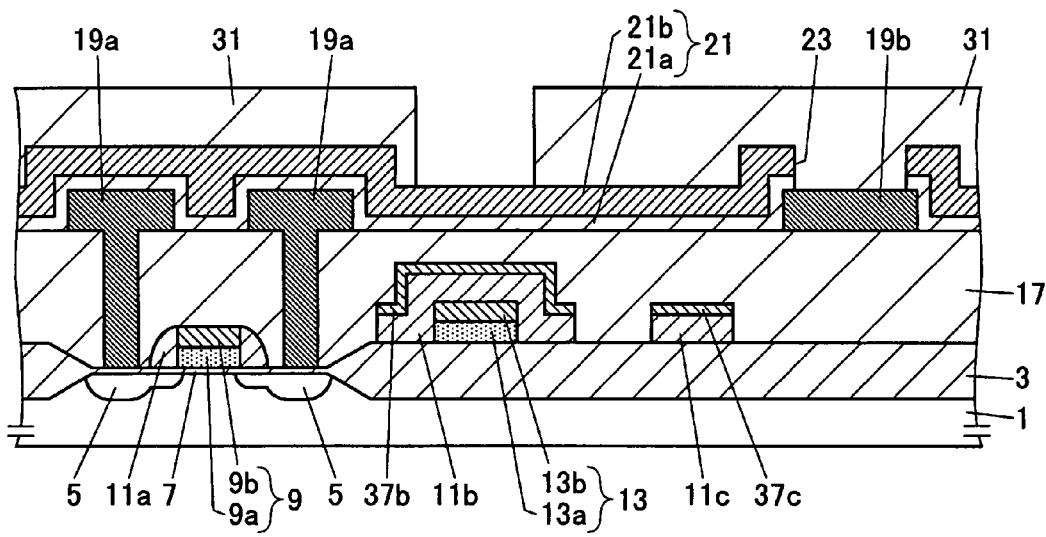
FIGS. 17A through 17C are drawings illustrating remaining steps in the exemplary method of producing the exemplary semiconductor device.
Figure 17B:
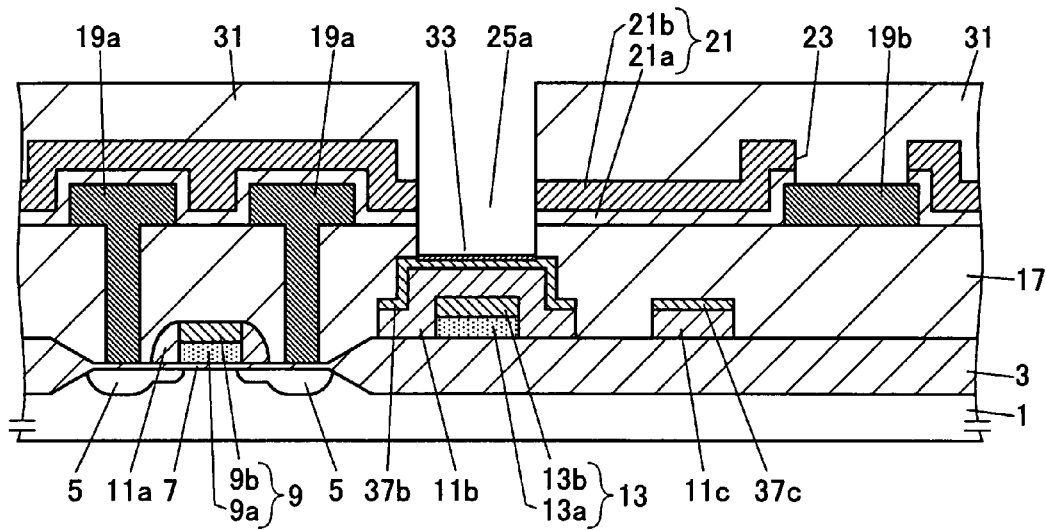
Figure 17C:
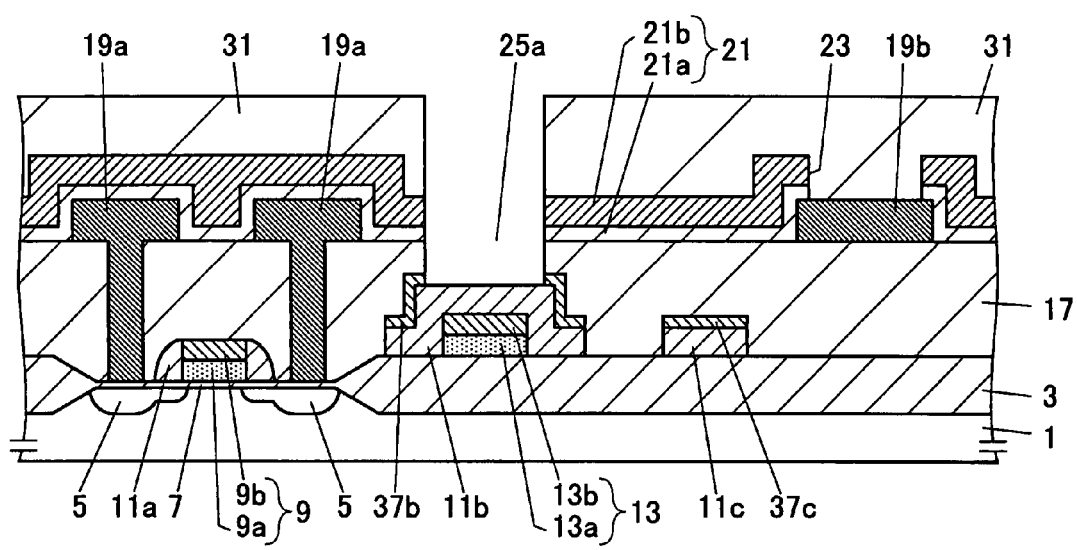

FIG. 14A is a cut-away side view of an exemplary semiconductor device according to still another embodiment of the present invention. FIG. 14B is a plan view of a portion around a trimming fuse of the exemplary semiconductor device. In FIG. 14B, an interlayer insulating film and a passivation film are omitted. The exemplary semiconductor device has a single-layer metal wiring structure. In FIGS. 14A and 14B, the same reference numbers are used for parts corresponding to those of the exemplary semiconductor device shown in FIGS. 1A and 1B, and descriptions of those parts are omitted.

The exemplary semiconductor device of this embodiment is different from that shown in FIGS. 1A and 1B in that an etching stop layer residue 37a on the side wall insulating film 11b covering the trimming fuse 13 and a resistance element 37c formed on the side wall insulating film 11c are made of a chromium silicon film (metal film). The etching stop layer residue 37a is shaped like a frame surrounding the trimming opening 25 and its cross section is exposed on the inner wall of the trimming opening 25. The etching stop layer residue 37a and the resistance element 37c are made of different portions of the same chromium silicon film having, for example, a thickness of 50 nm.

Figure 18:
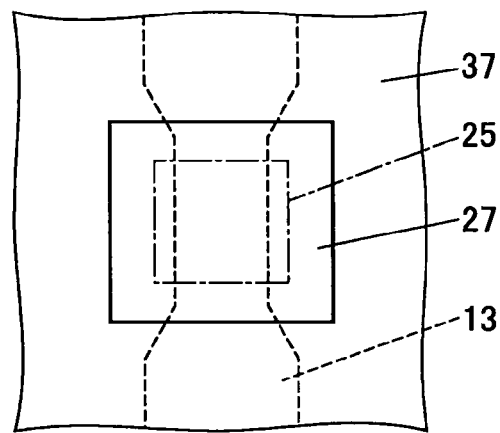
FIG. 18 is a plan view of a portion around a trimming fuse of the exemplary semiconductor device at step 3-3 shown in FIG. 15C.
Figure 19:
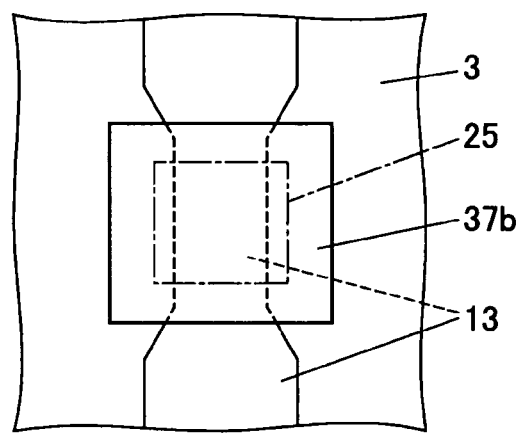
FIG. 19 is a plan view of a portion around a trimming fuse of the exemplary semiconductor device at step 4-3 shown in FIG. 16A.

FIGS. 15A through 17C are drawings illustrating steps in an exemplary method of producing the exemplary semiconductor device shown in FIGS. 14A and 14B. FIG. 18 is a plan view of a portion around the trimming fuse 13 of the exemplary semiconductor device at step 3-3 shown in FIG. 15C. FIG. 19 is a plan view of a portion around the trimming fuse 13 of the exemplary semiconductor device at step 4-3 shown in FIG. 16A. Steps 1-3 through 9-3 described below correspond to FIGS. 15A through 17C, respectively.

(1-3: FIG. 15A)

In substantially the same manner as step 1-1 (FIG. 2A), the field oxide film 3, the low-concentration diffusion layers 5a, the gate oxide film 7, the gate electrode 9 including the polysilicon film 9a and the tungsten silicide film 9b, and the trimming fuse 13 including the polysilicon film 13a and the tungsten silicide film 13b are formed on the semiconductor substrate 1.

(2-3: FIG. 15B)

In substantially the same manner as step 2-1 (FIG. 2B), the side wall insulating film 11 is formed. Then, a chromium silicon film 37 with a thickness of 50 nm is formed on the side wall insulating film 11 by, for example, argon sputtering.

(3-3: FIG. 15C)

A resist pattern 27 is formed by photolithography so as to cover a resistance element forming area (where the resistance element 37c is to be formed) and an etching stop layer forming area (where an etching stop layer 37b is to be formed) above the trimming fuse 13. The resist pattern 27 has an opening above the gate electrode 9 and its surrounding area. In other words, in a portion around the trimming fuse 13 shown in FIG. 18, the resist pattern 27 is formed on the chromium silicon film 37 so as to cover an area encompassing a trimming opening forming area (where the trimming opening 25 is to be formed).

(4-3: FIG. 16A)

Using the resist pattern 27 as a mask, the chromium silicon film 37 is etched to form the etching stop layer 37b and the resistance element 37c. This etching process is performed, for example, using a chemical dry etching (CDE) apparatus with the following conditions: microwave power=600 W; pressure=90 Pa; and mixed gas=$CF_4$ (400 sccm) and $O_2$ (100 sccm). Also using the resist pattern 27 as a mask, the side wall insulating film 11 is etched back to form the side wall 11a on the sides of the gate electrode 9. Then, the resist pattern 27 is removed. As a result, the side wall insulating film 11b and the etching stop layer 37b made of a chromium silicon film are formed on the trimming fuse 13 and the field oxide film 3 in an area encompassing the trimming opening forming area (see also FIG. 19). Also, the resistance element 37c and the side wall insulating film 11c are formed on the field oxide film 3.

(5-3: FIG. 16B)

In substantially the same manner as step 5-1 (FIG. 3B), the source-drain diffusion layers 5, the interlayer insulating film 17, connecting holes, the metal wiring layers 19a, the electrode pad 19b, and the passivation film 21 including the silicon dioxide film 21a and the silicon nitride film 21b are formed. During the ion implantation process for forming the source-drain diffusion layers 5, the etching stop layer 37b and the resistance element 37c may or may not be covered by a resist pattern.

(6-3: FIG. 16C)

In substantially the same manner as step 6-1 (FIG. 3C), the pad opening 23 is formed in the passivation film 21 above the electrode pad 19b using the resist pattern 29 as a mask.

(7-3: FIG. 17A)

In substantially the same manner as in step 7-1 (FIG. 4A), the resist pattern 29 is removed and the resist pattern 31 having an opening in the trimming opening forming area is formed on the passivation film 21.

(8-3: FIG. 17B)

In substantially the same manner as in step 8-1 (FIG. 4B), the passivation film 21 and the interlayer insulating film 17 are etched using the resist pattern 31 as a mask until the etching stop layer 37b is exposed. As a result, the opening 25a is formed through the passivation film 21 and the interlayer insulating film 17. In this step, as a result of etching the interlayer insulating film 17, a small amount of an etching product composed of C—F (C—F etching product 33) is formed on the etching stop layer 37b at the bottom of the opening 25a. Since the etching stop layer 37b is larger than the opening 25a when seen from above, the side wall insulating film 11b is not etched even when the interlayer insulating film 17 is etched. Thus, the etching process is entirely stopped by the etching stop layer 37b.

Meanwhile, with the etching conditions of step 8-3, the etching rate of a silicon nitride film is about 540 nm/min, the etching rate of a BPSG film is about 600 nm/min, and the etching rate of a chromium silicon film is about 5 nm/min. This means that removing the entire etching stop layer 37b made of a chromium silicon film with a thickness of 50 nm amounts to over-etching about 6000 nm of a BPSG film (the interlayer insulating film 17). Also, compared with the etching stop layers 15b and 15f made of a polysilicon film, the etching stop layer 37b made of a chromium silicon film shows better etching selectivity with an insulating film made of a silicon dioxide film. The etching selectivity between the etching stop layer 37b and an insulating film made of a silicon dioxide film may be improved further by adjusting etching conditions.

(9-3: FIG. 17C)

The C—F etching product 33 and the etching stop layer 37b are etched using, for example, a chemical dry etching (CDE) apparatus with the following conditions: microwave power=600 W; pressure=90 Pa; and mixed gas=$CF_4$ (400 sccm) and $O_2$ (100 sccm). As a result, the trimming opening 25 is formed. Also, around the trimming opening 25, the etching stop layer residue 37a is formed from the etching stop layer 37b.

After the above steps, the resist pattern 31 is removed (see FIG. 14A).

With the etching conditions of step 9-3, the etching rate of a chromium silicon film is about 50 nm/min and the etching rate of a silicon dioxide film is 2 to 3 nm/min. This means that even if the etching stop layer 37b made of a chromium silicon film with a thickness of 50 nm is over-etched by 100%, the side wall insulating film 11b made of a silicon dioxide film with a thickness of 150 nm is removed only about 2 to 3 nm. Therefore, compared with the etching stop layers 15b and 15f made of a polysilicon film, the etching stop layer 37b made of a chromium silicon film makes it possible to more accurately control the remaining thickness. The etching process in step 9-3 may also be performed in two stages as described above.

An exemplary constant-voltage generating circuit and an exemplary voltage detecting circuit according to an embodiment of the present invention are described below. Each of the exemplary constant-voltage generating circuit and the exemplary voltage detecting circuit includes at least one component of the exemplary semiconductor device shown in FIG. 1A.

Figure 20:
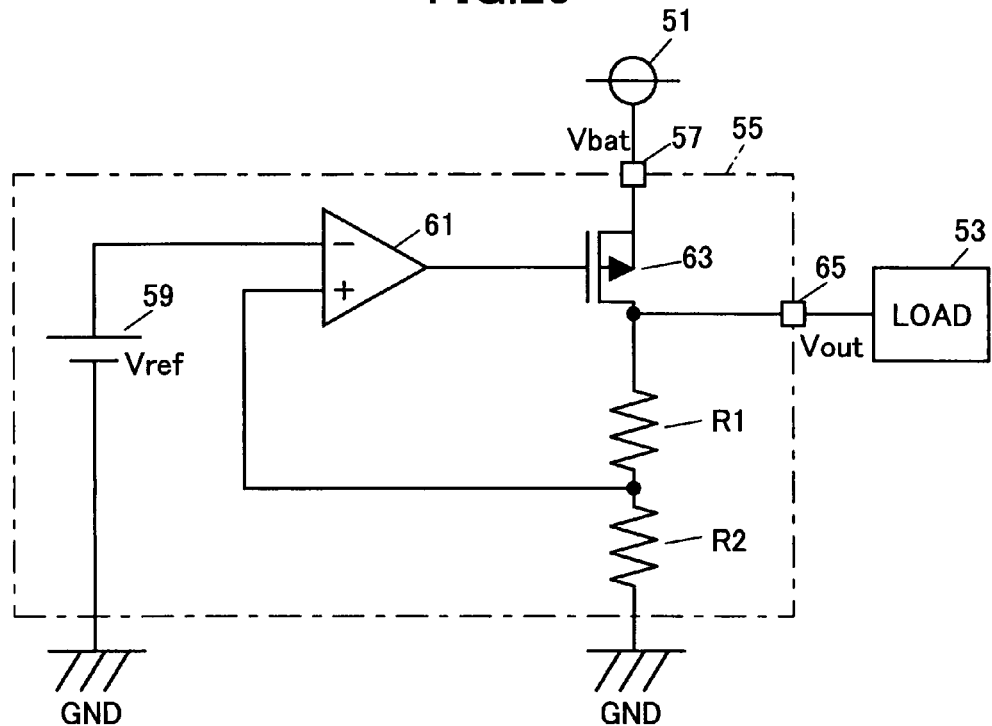
FIG. 20 is a circuit diagram illustrating a constant-voltage generating circuit of an exemplary semiconductor device according to an embodiment of the present invention.

FIG. 20 is a circuit diagram illustrating a constant-voltage generating circuit, which is an analog circuit, of an exemplary semiconductor device according to an embodiment of the present invention.

The exemplary semiconductor device includes a constant-voltage generating circuit 55 that regulates a power supply voltage from a DC power supply 51 and supplies a constant voltage to a load 53. The constant-voltage generating circuit 55 includes an input terminal (Vbat) 57 to which the DC power supply 51 is connected, a reference voltage generating circuit (Vref) 59, an operational amplifier (comparator) 61, a P-channel MOS transistor 63 constituting an output driver, voltage dividing resistors R1 and R2, and an output terminal (Vout) 65. The operational amplifier 61 includes at least one MOS transistor having a lightly doped drain (LDD) structure as shown in FIG. 1A.

In the constant-voltage generating circuit 55, the output terminal of the operational amplifier 61 is connected to the gate terminal of the P-channel MOS transistor 63, a reference voltage Vref from the reference voltage generating circuit 59 is applied to the inverting input terminal (−) of the operational amplifier 61, and a divided voltage obtained by dividing an output voltage Vout by the voltage dividing resistors R1 and R2 is applied to the non-inverting input terminal (+) of the operational amplifier 61. Thus, the operational amplifier 61 is configured such that the divided voltage becomes equal to the reference voltage Vref.

Figure 21:
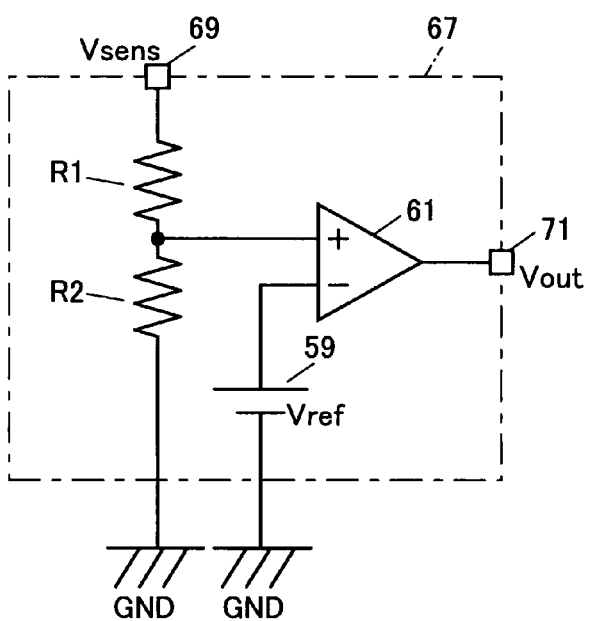
FIG. 21 is a circuit diagram illustrating a voltage detecting circuit of an exemplary semiconductor device according to an embodiment of the present invention.

FIG. 21 is a circuit diagram illustrating a voltage detecting circuit, which is an analog circuit, of an exemplary semiconductor device according to an embodiment of the present invention.

The exemplary semiconductor device includes a voltage detecting circuit 67. The voltage detecting circuit 67 includes a reference voltage generating circuit (Vref) 59, an operational amplifier 61, an input terminal (Vsens) 69, an output terminal (Vout) 71, and voltage dividing resistors R1 and R2. A reference voltage Vref from the reference voltage generating circuit 59 is applied to the inverting input terminal (−) of the operational amplifier 61. A voltage of a terminal to be measured is input from the input terminal 69 and divided by the voltage dividing resistors R1 and R2. The divided voltage is input to the non-inverting input terminal (+) of the operational amplifier 61. The output voltage from the operational amplifier 61 is output via the output terminal 71 to the outside. The operational amplifier 61 includes at least one MOS transistor having a lightly doped drain (LDD) structure as shown in FIG. 1A.

In the voltage detecting circuit 67, when the voltage of the terminal to be measured is high and the divided voltage is higher than the reference voltage Vref, an output signal from the operational amplifier 61 becomes high; and when the voltage of the terminal to be measured drops and the divided voltage becomes equal to or lower than the reference voltage Vref, the output signal from the operational amplifier 61 becomes low.

When constant-voltage generating circuits and voltage detecting circuits as shown in FIGS. 20 and 21 are manufactured in large amounts, the reference voltage Vref from the reference voltage generating circuit may vary because of manufacturing variation. Normally, to obviate this problem, a resistance circuit (voltage divider circuit) whose resistance is adjustable by cutting a trimming fuse is used as voltage dividing resistors.

Figure 22:
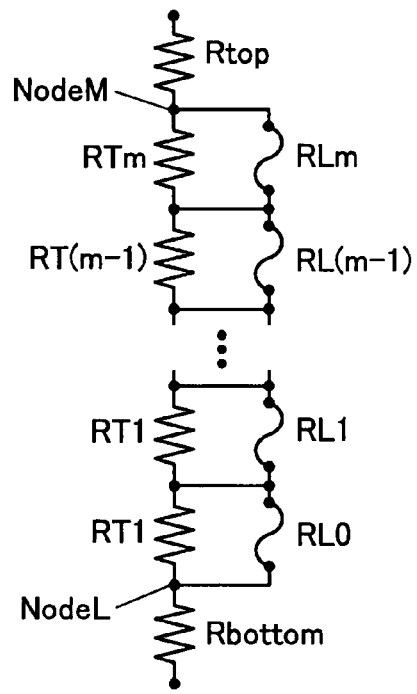
FIG. 22 is a circuit diagram illustrating an exemplary voltage divider circuit.
Figure 23:
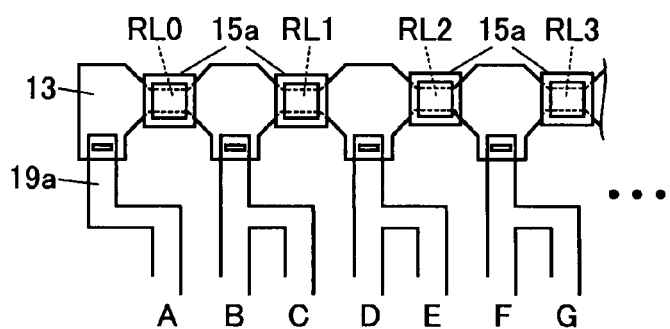
FIG. 23 is a drawing illustrating a layout of trimming fuses of the exemplary voltage divider circuit.
Figure 24:
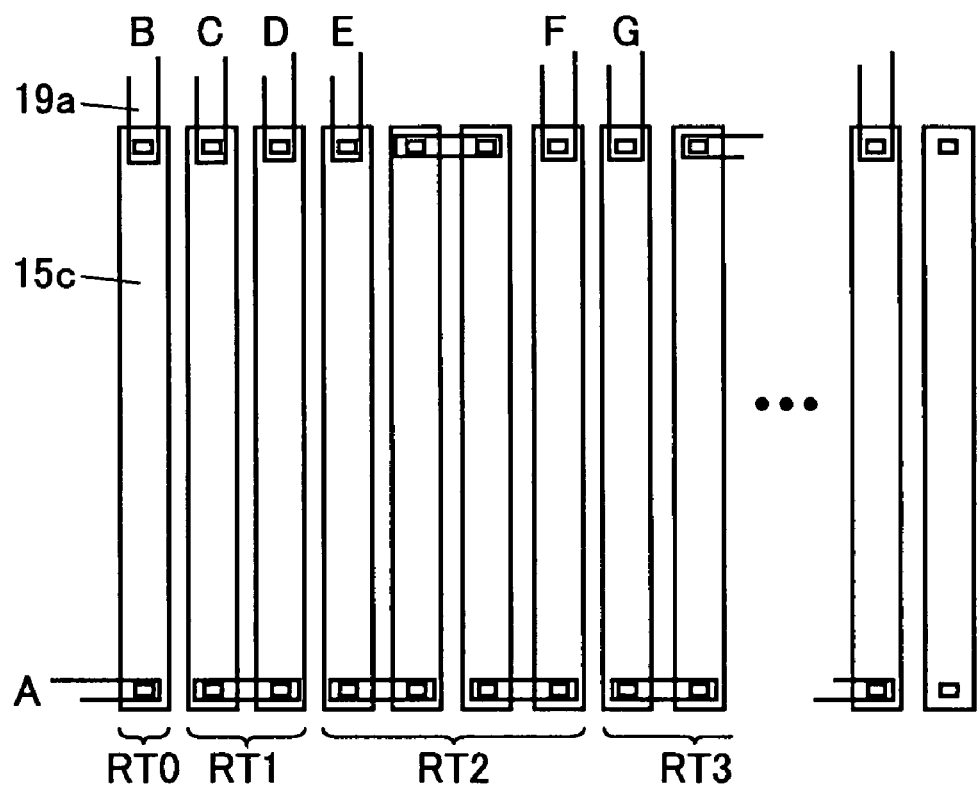
FIG. 24 is a drawing illustrating a layout of resistance elements of the exemplary voltage divider circuit.

FIG. 22 is a circuit diagram illustrating an exemplary voltage divider circuit. FIG. 23 is a drawing illustrating a layout of trimming fuses of the exemplary voltage divider circuit. FIG. 24 is a drawing illustrating a layout of resistance elements of the exemplary voltage divider circuit.

As shown in FIG. 22, the exemplary voltage divider circuit includes a resistance element Rbottom, m+1 (m is a positive integer) resistance elements RT0, RT1, . . . , RTm, and a resistance element Rtop that are connected in series. Trimming fuses RL0, RL1, . . . , RLm are connected in parallel with the resistance elements RT0, RT1, . . . , RTm.

The resistance values of the resistance elements RT0, RT1, . . . , RTm become gradually larger from the resistance element Rbottom to the resistance element Rtop in multiples of two. When the resistance value of the resistance element RT0 is a unit value, the resistance value of a resistance element RTn is represented by "$2^n \times$unit value" (n is a positive integer).

Referring to FIG. 23, the trimming fuses RL0, RL1, . . . , RLm are, for example, implemented by a polysilicon pattern with a sheet resistance between 20Ω and 40Ω. Each of the trimming fuses RL0, RL1, . . . , RLm is implemented by the trimming fuse 13 shown in FIGS. 1A and 1B. The side wall insulating film 11b and the etching stop layer residue 15a are formed on each of the trimming fuses RL0, RL1, . . . , RLm.

Referring to FIG. 24, the resistance elements RT0, RT1, . . . , RTm are implemented by the resistance elements 15c shown in FIGS. 1A and 1B. For example, the resistance element RT0 is composed of one resistance element 15c and a resistance element RTn is composed of $2^n$ resistance elements 15c.

In FIGS. 23 and 24, points A-A, B-B, C-C, D-D, E-E, F-F, and G-G are electrically connected, respectively, by the metal wiring layers 19a.

Thus, in the exemplary voltage divider circuit, pairs of resistance elements and trimming fuses are connected in series like a ladder to precisely set the resistance ratios of resistance elements and to improve the manufacturing accuracy.

The series resistance of the exemplary voltage divider circuit can be adjusted to a desired value by cutting the trimming fuses RL0, RL1, . . . , RLm as needed.

When the exemplary voltage divider circuit shown in FIG. 22 is used in place of the voltage dividing resistors R1 and R2 of the constant-voltage generating circuit 55 shown in FIG. 20, for example, the terminal of the resistance element Rbottom is grounded and the terminal of the resistance element Rtop is connected to the drain of the P-channel MOS transistor 63. Further, a terminal NodeL between the resistance elements Rbottom and RT0 or a terminal NodeM between the resistance elements Rtop and RTm is connected to the non-inverting input terminal (+) of the operational amplifier 61.

When the exemplary voltage divider circuit shown in FIG. 22 is used in place of the voltage dividing resistors R1 and R2 of the voltage detecting circuit 67, for example, the terminal of the resistance element Rbottom is grounded and the terminal of the resistance element Rtop is connected to the input terminal 69. Further, the terminal NodeL between the resistance elements Rbottom and RT0 or the terminal NodeM between the resistance elements Rtop and RTm is connected to the non-inverting input terminal (+) of the operational amplifier 61.

Embodiments of the present invention make it possible to accurately control the remaining thickness of an insulating film (a side wall insulating film 11b) on the trimming fuse 13 and thereby to accurately cut the trimming fuse 13 by a laser beam to adjust the resistance of a voltage divider. In other words, embodiments of the present invention make it possible to accurately adjust the resistance of the exemplary voltage divider circuit shown in FIG. 22. Also, using the exemplary voltage divider circuit as the voltage dividing resistors R1 and R2 of the constant-voltage generating circuit 55 and the voltage detecting circuit 67 shown in FIGS. 20 and 21 makes it possible to obtain an accurate divided voltage. This in turn makes it possible to improve the stability of the output voltage Vout from the constant-voltage generating circuit 55 and to improve the accuracy of voltage detection by the voltage detecting circuit 67.

Application of embodiments of the present invention is not limited to a constant-voltage generating circuit and a voltage detecting circuit. Embodiments of the present invention may be applied to any analog circuit comprising a voltage divider including resistance elements and trimming fuses for adjusting the resistance, a reference voltage source, and a comparator that includes multiple MOS transistors and is configured to compare a divided voltage from the voltage divider and a reference voltage from the reference voltage source.

Also, application of embodiments of the present invention is not limited to analog circuits. Embodiments of the present invention may be applied to any semiconductor device including a semiconductor substrate, a MOS transistor having a side wall, a trimming fuse, a resistance element, and an insulating film covering the MOS transistor, the trimming fuse, and the resistance element, the insulating film having a trimming opening for laser trimming in an area above the trimming fuse where the insulating film is thinner than in other areas.

The present invention is not limited to the specifically disclosed embodiments, and variations and modifications may be made without departing from the scope of the present invention. Dimensions, shapes, materials, arrangements, production processes, production conditions, and so on described in the embodiments are given as examples.

For example, although a semiconductor device having a single-layer metal wiring structure is used to describe the embodiments, the present invention may also be applied to a semiconductor device having a multilayer metal wiring structure. In a multilayer metal wiring structure, the electrode pad 19b described in the embodiments may be formed on any one of the constituent metal wiring layers.

An insulating film for isolating an element region is not limited to the field oxide film 3. For example, a shallow trench isolation (STI) layer may be used to isolate an element region.

The trimming fuse 13 and the resistance element 37c may be formed on a layer other than the field oxide film 3.

The gate electrode 9 and the trimming fuse 13 may be made of conductive films other than a polysilicon film and a tungsten silicide film.

Also, the gate electrode 9 and the trimming fuse 13 may be formed in separate steps.

In the above embodiments, a silicon dioxide film formed by LPCVD is used as the side wall insulating film 11. Alternatively, a silicon nitride film or a silicon dioxide film formed by other methods may be used as the side wall insulating film 11.

As the etching stop layers 15b and 15d, other types of silicon conductive films such as an amorphous silicon film may be used instead of a polysilicon film.

In the exemplary production methods described above, resist patterns are used as etching masks. Alternatively, insulating films or conductive films formed by lithography or by etching may be used as etching masks.

The pad opening 23 and the trimming opening 25 may be formed in part or entirely in the same etching process.

In steps 4-1, 4-2, and 4-3 described above, the etching process of the polysilicon film 15 (and 15e) or the chromium silicon film 37 and the etching process of the side wall insulating film 11 are performed using the same resist pattern 27. Alternatively, the polysilicon film 15 (and 15e) or the chromium silicon film 37 may be etched using a first mask pattern and the side wall insulating film 11 may be etched using a second mask pattern. In this case, sub-steps of removing the first mask pattern and forming the second mask pattern are added to steps 4-1, 4-2, and 4-3. Also in this case, the etching stop layer 15b, 15f, or 37b and the side wall insulating film 11b may have different planar shapes. Similarly, the resistance element 15c or 37c and the side wall insulating film 11c may have different planar shapes.

An embodiment of the present invention provides a method of producing a semiconductor device comprising a semiconductor substrate, a MOS transistor including a gate electrode and a side wall formed on sides of the gate electrode, a trimming fuse, a resistance element, and an insulating film covering the MOS transistor, the trimming fuse, and the resistance element, the insulating film having a trimming opening for laser trimming in an area above the trimming fuse where the insulating film is thinner than in other areas. The method includes the steps of (A) forming the gate electrode and the trimming fuse on the semiconductor substrate; (B) forming a side wall insulating film covering the gate electrode and the trimming fuse; (C) forming a conductive film on the side wall insulating film and patterning the conductive film to form an etching stop layer in an area encompassing a trimming opening forming area where the trimming opening is to be formed and to form the resistance element in a different area; (D) forming the side wall on the sides of the gate electrode by etching back the side wall insulating film using a mask pattern that covers at least the etching stop layer and the resistance element and exposes a portion of the side wall insulating film above the gate electrode and its surrounding area; (E) repeating, one or more times, sub-steps of forming an interlayer insulating film covering the entire semiconductor substrate and of forming an upper wiring layer on the interlayer insulating film, and then forming a passivation film covering the interlayer insulating film and the upper wiring layer; (F) removing the passivation film and the interlayer insulating film in the trimming opening forming area until the etching stop layer is exposed; and (G) forming the trimming opening by removing the etching stop layer in the trimming opening forming area. An embodiment of the present invention provides a semiconductor device comprising a semiconductor substrate; a MOS transistor including a gate electrode and a side wall formed on sides of the gate electrode; a trimming fuse; a resistance element; an insulating film covering the MOS transistor, the trimming fuse, and the resistance element, the insulating film having a trimming opening for laser trimming in an area above the trimming fuse where the insulating film is thinner than in other areas; and an etching stop layer residue shaped like a frame surrounding the trimming opening, a cross section of the etching stop layer residue being exposed on an inner wall of the trimming opening. In the semiconductor device, the resistance element is made of a conductive film formed separately from the gate electrode and the trimming fuse and is formed on the semiconductor substrate at least via a side wall insulating film; the thinner portion of the insulating film which thinner portion is under the trimming opening and above the trimming fuse is made of a part of the side wall insulating film; the side wall is formed by etching back the side wall insulating film and the width of the side wall in a direction orthogonal to the sides of the gate electrode is the same as the thickness of the side wall insulating film; and the etching stop layer residue is formed on the side wall insulating film and is made of the same conductive film as that of the resistance element.

In the above embodiments, the semiconductor substrate of the semiconductor device may include an epitaxially grown layer and wells.

In step (E), the sub-step of forming an upper wiring layer may include a process of forming connecting holes.

The conductive film formed in step (C) may be made of a metal film. Examples of materials used for the metal film include nickel chrome (NiCr), tantalum nitride (TaN), chromium silicide ($CrSi_2$), chromium silicon nitride (CrSiN), chromium silicon (CrSi), chromium silicon oxide (CrSiO), titanium tungsten (TiW), and tungsten (W).

In the semiconductor device described above, the width of the side wall in a direction orthogonal to the sides of the gate electrode may indicate the width in that direction of the widest portion of the side wall.

According to the above embodiments, the etching stop layer (and the etching stop layer residue) and the resistance element are made of the same conductive film and the thinner portion of the insulating film is made of a part of the side wall insulating film. This configuration or method eliminates the need to form additional films dedicated to the etching stop layer and the thinner portion of the insulating film. Also, the above embodiments make it possible to achieve high etching selectivity between the etching stop layer and the insulating film and thereby make it possible to accurately control the remaining thickness of the insulating film above the trimming fuse.

With a constant thickness of the insulating film above the trimming fuse, it becomes possible to stably and accurately perform laser trimming without increasing the intensity of a laser beam and to reduce the time necessary to perform laser trimming.

The side wall and the side wall insulating film may be made of a silicon dioxide film. Compared with a case where a silicon nitride film is used, using a silicon dioxide film as the side wall insulating film, which constitutes the thinner portion of the insulating film above the trimming fuse, makes it possible to reduce reflection of a laser beam used for laser trimming.

The above method may further include, between steps (E) and (F), a step of forming a pad opening by removing the passivation film in an area above the upper wiring layer. In this case, steps (F) and (G) are performed with the pad opening covered by a mask pattern.

Covering the pad opening during steps (F) and (G) prevents the upper wiring layer (electrode pad) from being etched and thereby makes it possible to maintain electrical connectivity of the upper wiring layer. Also, covering the pad opening prevents a reaction product of metal of the upper wiring layer from being formed, adhering to the upper surface of the etching stop layer, and thereby inhibiting the etching process of the etching stop layer.

Step (C) of the above method may be designed such that a non-doped silicon film comprising non-doped polysilicon or non-doped amorphous silicon is formed as the conductive film, a doped silicon film portion and a non-doped silicon film portion are formed by implanting impurity ions into the non-doped silicon film by ion-implantation using a mask pattern covering at least the trimming opening forming area and exposing at least a resistance element forming area where the resistance element is to be formed, and the conductive film composed of the doped silicon film portion and the non-doped silicon film portion is patterned to form the etching stop layer and the resistance element. Using a non-doped silicon film instead of a doped silicon film as the etching stop layer improves the etching selectivity between the etching stop layer and the side wall insulating film and between the etching stop layer and the interlayer insulating film.

Step (G) of the above method may be designed such that the etching stop layer is removed by a dry etching process including a first stage and a second stage, and a condition of the dry etching process is changed in the second stage so that etching selectivity between the etching stop layer and the side wall insulating film becomes higher than that in the first stage. This method makes it possible to reduce the amount of the side wall insulating film to be removed when the etching stop layer in the trimming opening forming area is removed.

The conductive film formed in step (C) of the above method may be composed of a metal film. In other words, the etching stop layer and the resistance element may be composed of a metal film. Using a metal film instead of a silicon film for the etching stop layer further improves the etching selectivity between the etching stop layer and the sidewall insulating film and thereby makes it possible to reduce the amount of the side wall insulating film to be removed when the etching stop layer in the trimming opening forming area is removed in step (G).

In the above method, the gate electrode and the trimming fuse may be made of the same conductive material. This makes it possible to form the gate electrode and the trimming fuse at once and thereby to reduce the number of steps necessary to produce the semiconductor device.

In the above method, step (C) may be designed such that the etching stop layer and the resistance element are formed using a mask pattern that defines areas where the etching stop layer and the resistance element are to be formed and that exposes a portion of the conductive film above the gate electrode and its surrounding area; and step (D) may be designed such that the side wall is formed using the same mask pattern as that used in step (C). This method reduces the number of mask patterns to be formed and thereby makes it possible to reduce the number of steps necessary to produce the semiconductor device.

The present invention is not limited to the specifically disclosed embodiments, and variations and modifications may be made without departing from the scope of the present invention.

The present application is based on Japanese Priority Application No. 2006-250406, filed on Sep. 15, 2006, the entire contents of which are hereby incorporated herein by reference.

What is claimed is:

1. A method of producing a semiconductor device comprising a semiconductor substrate, a MOS transistor including a gate electrode and a side wall formed on sides of the gate electrode, a trimming fuse, a resistance element, and an insulating film covering the MOS transistor, the trimming fuse, and the resistance element, the insulating film having a trimming opening for laser trimming in an area above the trimming fuse where the insulating film is thinner than in other areas, the method comprising the steps of:

(A) forming the gate electrode and the trimming fuse on the semiconductor substrate;

(B) forming a side wall insulating film covering the gate electrode and the trimming fuse;

(C) forming a conductive film on the side wall insulating film and patterning the conductive film to form an etching stop layer in an area encompassing a trimming opening forming area where the trimming opening is to be formed and to form the resistance element in a different area;

(D) forming the side wall on the sides of the gate electrode by etching back the side wall insulating film using a mask pattern that covers at least the etching stop layer and the resistance element and exposes a portion of the side wall insulating film above the gate electrode and its surrounding area;

(E) repeating, one or more times, sub-steps of forming an interlayer insulating film covering the entire semiconductor substrate and of forming an upper wiring layer on the interlayer insulating film, and then forming a passivation film covering the interlayer insulating film and the upper wiring layer;

(F) removing the passivation film and the interlayer insulating film in the trimming opening forming area until the etching stop layer is exposed; and (G) forming the trimming opening by removing the etching stop layer in the trimming opening forming area.

2. The method as claimed in claim 1, wherein the side wall insulating film is a silicon dioxide film.

3. The method as claimed in claim 1, further comprising, between steps (E) and (F), the step of:

forming a pad opening by removing the passivation film in an area above the upper wiring layer;

wherein steps (F) and (G) are performed with the pad opening covered by a mask pattern.

4. The method as claimed in claim 1, wherein the conductive film formed in step (C) comprises polysilicon or amorphous silicon.

5. The method as claimed in claim 4, wherein, in step (C), a non-doped silicon film comprising non-doped polysilicon or non-doped amorphous silicon is formed as the conductive film, a doped silicon film portion and a non-doped silicon film portion are formed by implanting impurity ions into the non-doped silicon film by ion-implantation using a mask pattern covering at least the trimming opening forming area and exposing at least a resistance element forming area where the resistance element is to be formed, and the conductive film composed of the doped silicon film portion and the non-doped silicon film portion is patterned to form the etching stop layer and the resistance element.

6. The method as claimed in claim 1, wherein the conductive film formed in step (C) is a metal film.

7. The method as claimed in claim 1, wherein in step (G), the etching stop layer in the trimming opening forming area is removed by a dry etching process including a first stage and a second stage; and a condition of the dry etching process is changed in the second stage so that etching selectivity between the etching stop layer and the side wall insulating film becomes higher than that in the first stage.

8. The method as claimed in claim 1, wherein the gate electrode and the trimming fuse are composed of the same conductive material.

9. The method as claimed in claim 1, wherein in step (C), the etching stop layer and the resistance element are formed using a mask pattern that defines areas where the etching stop layer and the resistance element are to be formed and that exposes a portion of the conductive film above the gate electrode and its surrounding area; and in step (D), the side wall is formed using the same mask pattern as that used in step (C).

* * * * *